US010287160B2

(12) United States Patent
Akiba et al.

(10) Patent No.: US 10,287,160 B2
(45) Date of Patent: May 14, 2019

(54) ELECTROSTATIC DEVICE

(71) Applicant: Sony Corporation, Tokyo (JP)

(72) Inventors: Akira Akiba, Kanagawa (JP); Mitsuo Hashimoto, Kanagawa (JP); Shinya Morita, Tokyo (JP); Munekatsu Fukuyama, Tokyo (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 15/508,913

(22) PCT Filed: Aug. 18, 2015

(86) PCT No.: PCT/JP2015/004083
§ 371 (c)(1),
(2) Date: Mar. 4, 2017

(87) PCT Pub. No.: WO2016/038794
PCT Pub. Date: Mar. 17, 2016

(65) Prior Publication Data
US 2017/0183219 A1 Jun. 29, 2017

(30) Foreign Application Priority Data
Sep. 11, 2014 (JP) ................................. 2014-184920

(51) Int. Cl.
B81B 5/00 (2006.01)
H02N 1/04 (2006.01)
(Continued)

(52) U.S. Cl.
CPC .............. *B81B 5/00* (2013.01); *H01H 59/00* (2013.01); *H02N 1/002* (2013.01); *H02N 1/008* (2013.01);
(Continued)

(58) Field of Classification Search
CPC ......... B81B 2203/04; B81B 5/00; B81B 3/00; H01H 59/00; H02N 1/002; H02N 1/04; H02N 1/00; H02N 1/008
(Continued)

(56) References Cited

U.S. PATENT DOCUMENTS 4,754,185 A * 6/1988 Gabriel ................. H02N 1/004
310/309
5,428,259 A 6/1995 Suzuki
5,554,304 A 9/1996 Suzuki
(Continued)

FOREIGN PATENT DOCUMENTS

JP 03-230779 A 10/1991
JP 10-190008 A 7/1998
(Continued)

Primary Examiner — Alex W Mok
(74) Attorney, Agent, or Firm — Wolf, Greenfield & Sacks, P.C.

(57) ABSTRACT

[Object] To provide an electrostatic device capable of improving device characteristics.
[Solving Means] An electrostatic device according to an embodiment of the present technology includes an electrically conductive base material, a first conductor layer, a second conductor layer, and a bonding layer. The first conductor layer includes a first electrode portion and a first base portion and is connected to a signal line. The first base portion supports the first electrode portion and is disposed on the base material. The second conductor layer includes a second electrode portion and a second base portion and is connected to a reference potential. The second electrode portion is opposed to the first electrode portion in a first axis direction and configured to be movable relative to the first electrode portion in the first axis direction. The second base portion supports the second electrode portion and is disposed on the base material. The bonding layer is disposed between the base material and the first and second base portions and includes a plurality of first bonding portions that partially support at least the first base portion.

17 Claims, 15 Drawing Sheets

(51) Int. Cl.
  *H02N 1/00* (2006.01)
  *H01H 59/00* (2006.01)
  *B81B 3/00* (2006.01)

(52) U.S. Cl.
  CPC ............ *H02N 1/04* (2013.01); *B81B 3/00* (2013.01); *B81B 2203/04* (2013.01); *H02N 1/00* (2013.01)

(58) Field of Classification Search
  USPC ........................................... 310/309
  See application file for complete search history.

(56) References Cited

U.S. PATENT DOCUMENTS

| | | | | |
|---|---|---|---|---|
| 5,710,466 | A * | 1/1998 | Allen | F04D 13/06 310/40 MM |
| 6,127,767 | A * | 10/2000 | Lee | G01C 19/5726 310/309 |
| 6,190,571 | B1 | 2/2001 | Kato | |
| 6,507,138 | B1 * | 1/2003 | Rodgers | B81B 3/0021 310/309 |
| 7,161,273 | B2 * | 1/2007 | Akiba | H01H 59/0009 310/309 |
| 7,504,757 | B2 * | 3/2009 | Subramanian | B81C 1/00626 310/309 |
| 7,636,277 | B2 * | 12/2009 | Minotti | G04C 3/12 310/309 |

FOREIGN PATENT DOCUMENTS

| | | |
|---|---|---|
| JP | 2008-036726 A | 2/2008 |
| JP | 2008-052220 A | 3/2008 |
| JP | 2009-142048 A | 6/2009 |

* cited by examiner

ELECTROSTATIC DEVICE

This is a U.S. National Stage Application under 35 U.S.C. § 371, based on International Application No. PCT/JP2015/004083, filed Aug. 18, 2015, which claims priority to Japanese Patent Application JP 2014-184920, filed Sep. 11, 2014, each of which is hereby incorporated by reference in its entirety.

TECHNICAL FIELD

The present technology relates to an electrostatic device applicable to an electrostatic drive actuator or electrostatic sensor, for example.

BACKGROUND ART

In recent years, MEMS (Micro Electro Mechanical Systems) devices are widely developed. The MEMS generally means a device technology such as an actuator and a sensor including micro mechanisms or a process technology developed on the basis of a semiconductor process for forming micro structures and mechanisms thereof. The MEMS device means an actuator or sensor manufactured using such an MEMS technology.

SOI (Silicon On Insulator) substrates are widely used for manufacturing MEMS devices. The SOI substrate is formed of a laminate of a supporting layer made from silicon, a BOX (Buried Oxide) layer made from silicon oxide ($SiO_2$) formed on the supporting layer, and an active layer made from silicon bonded on the BOX layer. In structure design of the MEMS device manufactured from the SOI substrate, typically, structures and mechanisms serving as functional parts are formed in an active layer. Some of the structures are mechanically, electrically connected to the supporting layer via the BOX layer. Mechanical, electrical characteristics of the actuator or sensor serving as the MEMS device are formed in the active layer. The BOX layer and the supporting layer mainly serve to ensure rigidity and strength for packaging.

For example, Patent Literature 1 has disclosed a two-axis electrostatic tilt mirror element constituted of an SOI substrate.

CITATION LIST

Patent Literature

Patent Literature 1: Japanese Patent Application Laid-open No. 2008-52220

DISCLOSURE OF INVENTION

Technical Problem

In the MEMS device manufactured from the SOI substrate, electrical characteristics of the BOX layer and the supporting layer considerably affect the actuator or sensor formed in the active layer. For example, an electrostatic drive MEMS device has problems regarding malfunctions or lower reliability due to electrification of the BOX layer, increased driving power or lower detection sensitivity due to an increase in capacitance (parasitic capacitance), which is formed by the active layer, the BOX layer, and the supporting layer, and the like.

In view of the above-mentioned circumstances, it is an object of the present technology to provide an electrostatic device capable of improving device characteristics.

Solution to Problem

An electrostatic device according to an embodiment of the present technology includes an electrically conductive base material, a first conductor layer, a second conductor layer, and a bonding layer.

The first conductor layer includes a first electrode portion and a first base portion and is connected to a signal line. The first base portion supports the first electrode portion and is disposed on the base material. The second conductor layer includes a second electrode portion and a second base portion and is connected to a reference potential.

The second electrode portion is opposed to the first electrode portion in a first axis direction and configured to be movable relative to the first electrode portion in the first axis direction. The second base portion supports the second electrode portion and is disposed on the base material.

The bonding layer is disposed between the base material and the first and second base portions and includes a plurality of first bonding portions that partially support at least the first base portion.

In the above-mentioned electrostatic device, one of the first and second electrode portions functions as a movable electrode and the other functions as a fixed electrode. The signal line configures a signal input line that generates electrostatic force between the first and second electrode portions or configures a signal output line that outputs a voltage signal corresponding to a relative distance between the first and second electrode portions. In the former case, the electrostatic device functions as an electrostatic actuator. In the latter case, the electrostatic device functions as an electrostatic sensor.

In the above-mentioned electrostatic device, the first base layer that supports the first electrode portion and the second base layer that supports the second electrode portion are supported above the base material via the bonding layer. Further, the first base portion connected to the signal line is partially supported by the plurality of first bonding portions. Therefore, in comparison with the case where an entire surface of the first base portion is supported above the base material via an electrically isolative bonding layer, the area of the bonding layer interposed between the first base portion and the base material is made smaller and adverse influences on the device, which are caused due to electrification of the bonding layer or a parasitic capacitance. With this, it becomes possible to improve the detection sensitivity. For example, it becomes possible to ensure favorable operation characteristics, reduce the driving power consumption, and enhance the detection sensitivity.

Typically, the first base portion is formed in a columnar shape having a long side in the first axis direction, and the first electrode portion includes a plurality of electrode pieces extending in a second axis direction crossing the first axis direction, the plurality of electrode pieces being arrayed in the first axis direction.

In the above-mentioned configuration, the first base portion includes both end portions in the long-side direction and a suspension portion. The both end portions are supported by the plurality of first bonding portions. The suspension portion is provided between the both end portions and supports the plurality of electrode pieces.

With this, it becomes possible to minimize the area of the bonding layer and stably support the first base layer on the base material.

For example, the suspension portion is formed of a plate portion whose width along the second axis direction is narrower than a width of each of the both end portions and is smaller than a height dimension along a third axis direction orthogonal to the first and second axis directions. Alternatively, the suspension portion may include a plurality of hollow portions. The form of the hollow portions is not particularly limited. For example, the suspension portion may have a grid structure or rudder structure. Alternatively, the plurality of first bonding portions may be configured to support the both end portions and a center portion of the first base portion in a longitudinal direction.

Typically, the second electrode portion includes a plurality of electrode pieces opposed to a plurality of electrode pieces that constitute the first electrode portion, and the second base portion includes an elastically deformable coupling piece that supports the second electrode portion to be movable in the first axis direction when the second electrode portion is configured as a movable electrode.

The bonding layer may further include a plurality of second bonding portions that partially support the second base portion. With this, a parasitic capacitance and the like between the second base layer and the base material can also be reduced, and hence the device characteristics can be further improved.

The first electrode portion may be configured as a fixed electrode or may be configured as a movable electrode. When the first electrode portion is configured as a movable electrode, the first base portion includes an elastically deformable coupling piece that supports the first electrode portion to be movable in the first axis direction.

In this case, the above-mentioned electrostatic device may further include a pad section, a terminal section, a wiring layer, and an interlayer insulating layer.

The pad section is disposed on the first base portion and electrically connected to the signal line. The terminal section is disposed on the first base portion and electrically connected to the first base portion. The wiring layer electrically connects between the pad section and the terminal section. The interlayer insulating layer is disposed between the first base portion and the wiring layer.

Further, the plurality of first bonding portions are selectively disposed directly below the first and second terminal sections.

In accordance with the above-mentioned configuration, a capacitance between the first base portion and the base material in the formation region of the wiring layer can be reduced, and hence the driving voltage of the first electrode portion connected to the signal line can be reduced. Alternatively, it becomes possible to accurately detect movement of the first electrode portion relative to the second electrode portion.

The first base portion may include a plurality of cutouts formed along an extending direction of the wiring layer. With this, the facing area between the base material and the first base portion can be reduced, and hence a parasitic capacitance therebetween can be reduced.

Similarly, the interlayer insulating layer may include a gap portion that forms a clearance between the first base portion and the wiring layer.

In addition, the interlayer insulating layer and the first base portion may each include a gap portion that forms a clearance between the base material and the wiring layer.

Advantageous Effects of Invention

As described above, in accordance with the present technology, it is possible to improve device characteristics.

It should be noted that the effect described here is not necessarily limitative and may be any effect described in the present disclosure.

MODE(S) FOR CARRYING OUT THE INVENTION

Hereinafter, embodiments according to the present technology will be described with reference to the drawings.

First Embodiment

Figure 1:
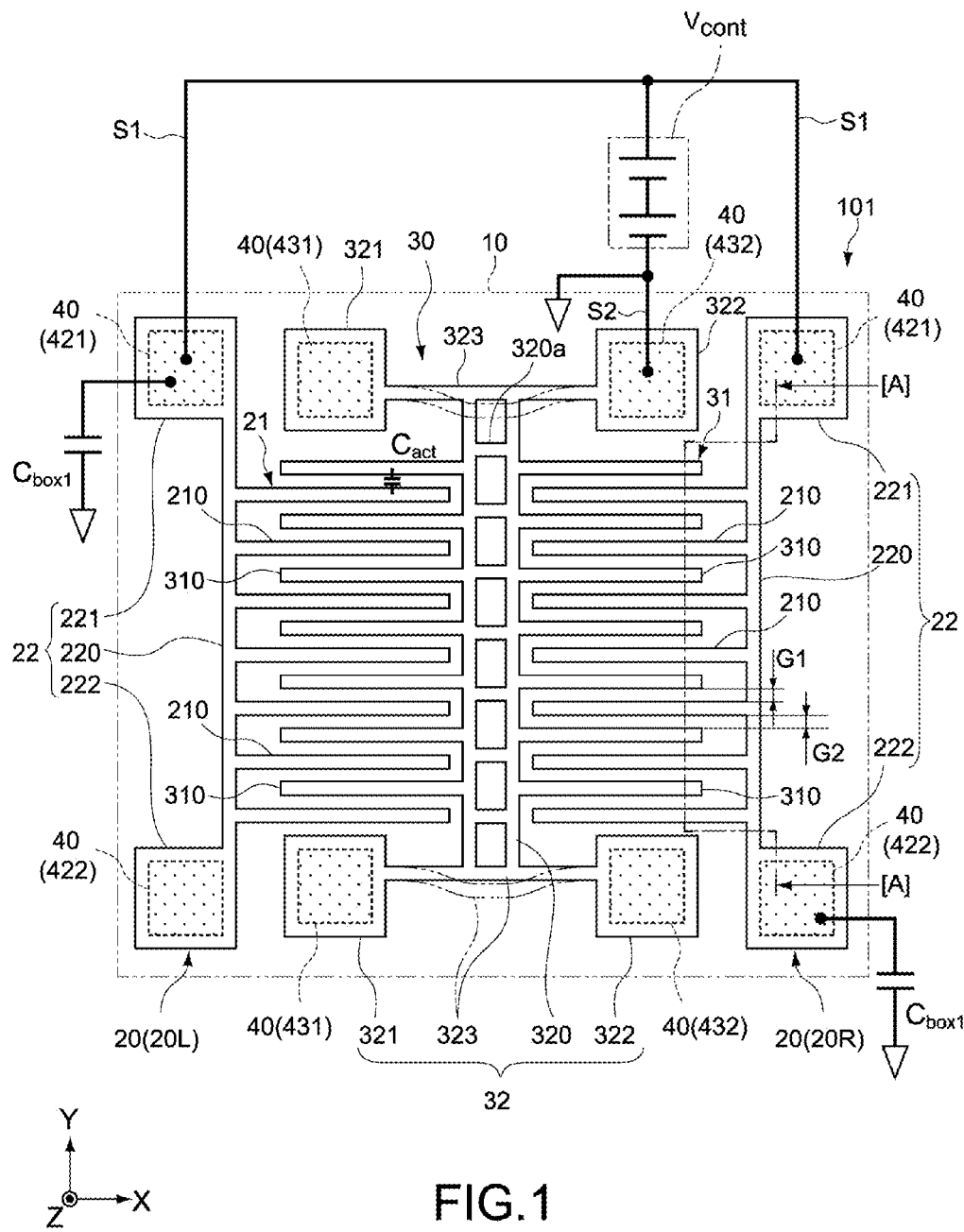
FIG. 1 A schematic plan view showing a configuration of an electrostatic device according to a first embodiment of the present technology.
Figure 2:
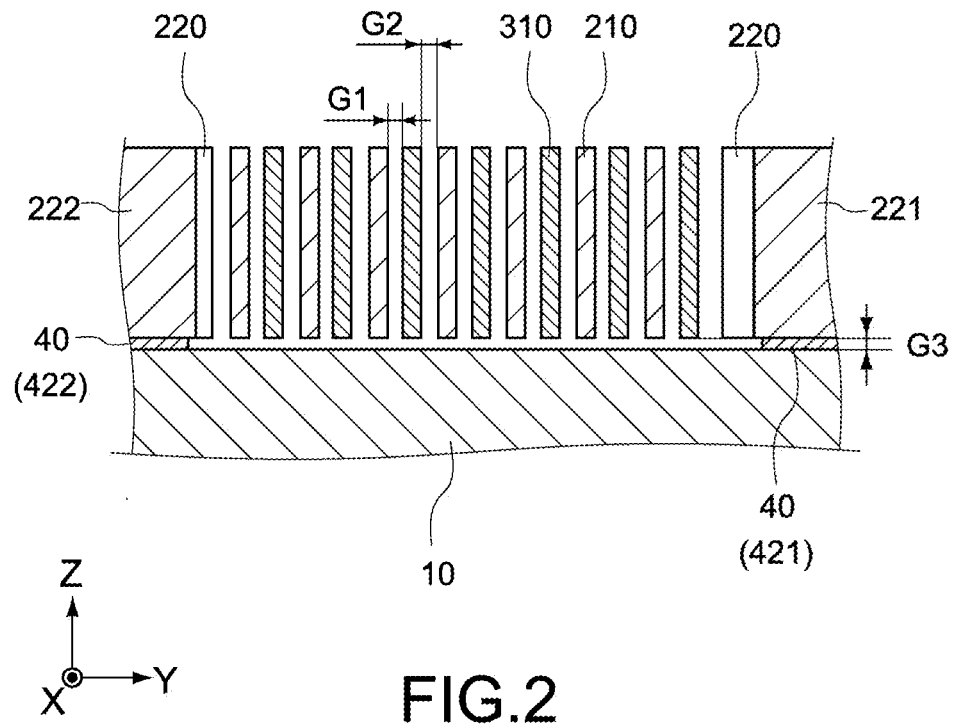
FIG. 2 A cross-sectional view taken along the [A]-[A] line of FIG. 1.

FIG. 1 is a schematic plan view showing an electrostatic device 101 according to an embodiment of the present technology. FIG. 2 is a cross-sectional view taken along the [A]-[A] line of FIG. 1.

In FIGS. 1 and 2, an X-axis and a Y-axis indicate plane directions orthogonal to each other and a Z-axis indicates a height (thickness) direction orthogonal to them. The same applies to the figures shown below.

Configuration of Electrostatic Device

The electrostatic device 101 includes a base material 10, a fixed electrode layer 20 (first conductor layer), a movable electrode layer 30 (second conductor layer), and bonding layers 40. The fixed electrode layer 20 includes two fixed electrode layers 20L, 20R. Hereinafter, unless they are individually described, the fixed electrode layers 20L, 20R will be collectively referred to as the fixed electrode layer 20.

The electrostatic device 101 according to this embodiment is electrically connected to a control circuit (driving circuit) including a power supply for control Vcont. The electrostatic device 101 according to this embodiment is configured as an electrostatic actuator driven by a direct-current voltage input between the fixed electrode layer 20 and the movable electrode layer 30.

The base material 10 is constituted of a conductive, approximately rectangular plate material. In this embodiment, the base material 10 is formed of a silicon substrate. The specific electrical resistance and thickness of the base material 10 are not particularly limited. Typically, the specific electrical resistance of the base material 10 is several Ω cm to several MΩ cm and the thickness of the base material 10 is several tens of μm to several hundreds of μm.

The base material 10 is typically formed by machining a supporting layer in an SOI substrate into a predetermined shape. The base material 10 is configured as a supporting substrate that supports an actuator section or sensor section in the electrostatic device 101. The base material 10 is formed having such a size that it can support the actuator section or sensor section. The base material 10 may be formed having such a size that it can commonly support a plurality of actuator sections or sensor sections described above.

The fixed electrode layer 20 and the movable electrode layer 30 are typically formed of silicon substrates. The specific electrical resistance and thickness of the fixed electrode layer 20 and the movable electrode layer 30 are not particularly limited. Typically, the specific electrical resistance of the fixed electrode layer 20 is several Ωcm to several MΩcm and the thickness of the fixed electrode layer 20 is several μm to 100 μm.

The fixed electrode layer 20 and the movable electrode layer 30 are formed by micromachining a common silicon substrate. The fixed electrode layer 20 and the movable electrode layer 30 are typically constituted of active layers in the SOI substrate. The fixed electrode layer 20 and the movable electrode layer 30 are separated from each other and disposed on the base material 10. The fixed electrode layer 20 and the movable electrode layer 30 each have a comb teeth-shaped electrode structure as will be described later.

When the electrostatic device 101 is configured as an electrostatic actuator, the fixed electrode layer 20 and the movable electrode layer 30 configure an actuator mechanism. On the other hand, when the electrostatic device 101 is configured as an electrostatic sensor, the fixed electrode layer 20 and the movable electrode layer 30 configure a sensing mechanism.

The bonding layers 40 are formed of electrically isolative materials disposed between the base material 10 and the fixed electrode layer 20 and movable electrode layer 30. In this embodiment, the bonding layers 40 are formed of silicon oxide films. The thickness of the bonding layers 40 is not particularly limited. The thickness of the bonding layers 40 is several μm, for example. The bonding layers 40 are provided in the shaded regions of FIG. 1 (the same applies to embodiments to be described later).

The bonding layers 40 are typically formed by machining a BOX layer in the SOI substrate into predetermined shapes. The bonding layers 40 bond the base material 10 and the fixed electrode layer 20 to each other and the base material 10 and the movable electrode layer 30 to each other. In this embodiment, as will be described later, the bonding layers 40 include a plurality of bonding portions 421, 422, 431, 432 that partially support base portions 22, 32 of the fixed electrode layer 20 and the movable electrode layer 30.

Hereinafter, the fixed electrode layer 20 and the movable electrode layer 30 will be described in detail.

Fixed Electrode Layer

The fixed electrode layer 20 is, as described above, constituted of the two fixed electrode layers 20L, 20R. The fixed electrode layers 20L, 20R are disposed opposed to each other in an X-axis direction with the movable electrode layer 30 being sandwiched therebetween. That is, in FIG. 1, one fixed electrode layer 20L is disposed on a left-hand side of the movable electrode layer 30 and the other fixed electrode layer 20R is disposed on a right-hand side of the movable electrode layer 30. The fixed electrode layers 20L, 20R are formed in a shape symmetrical with respect to a Y-axis direction.

The fixed electrode layer 20 includes a fixed electrode portion 21 (first electrode portion) and the base portion 22 (first base portion). The fixed electrode portion 21 and the base portion 22 are each formed having an approximately identical thickness.

The fixed electrode portion 21 includes a plurality of fixed electrode pieces 210 extending in the X-axis direction and arrayed in the Y-axis direction. The number of fixed electrode pieces 210 is not particularly limited. The number of fixed electrode pieces 210 is appropriately set in a manner that depends on required device characteristics. In this embodiment, the plurality of fixed electrode pieces 210 are arrayed at equal intervals in the Y-axis direction. However, the plurality of fixed electrode pieces 210 are not limited thereto as a matter of course.

As shown in FIG. 1, in the one fixed electrode layer 20L, the plurality of fixed electrode pieces 210 are formed protruding rightward from a suspension portion 220 of the base portion 22. Meanwhile, in the other fixed electrode layer 20R, the plurality of fixed electrode pieces 210 are formed protruding leftward from the suspension portion 220 of the base portion 22. The fixed electrode pieces 210 of the fixed electrode layer 20L and the fixed electrode pieces 210 of the fixed electrode layer 20R are disposed opposed to each other in the X-axis direction.

The plurality of fixed electrode pieces 210 are each formed in an approximately identical shape. The plurality of fixed electrode pieces 210 each have a length direction along the X-axis direction, a width direction along in the Y-axis direction, and a height (thickness) direction in a Z-axis direction. Each of the fixed electrode pieces 210 is formed in a plate shape whose height dimension along the Z-axis direction is larger than the width dimension along the Y-axis direction and is perpendicular to the base material 10. The width and length of the fixed electrode piece 210 are not particularly limited. For example, the width of the fixed electrode piece 210 is 1 µm or more, 5 µm or less and the length of the fixed electrode piece 210 is 50 µm or more, 200 µm.

As shown in FIG. 2, lower ends of the fixed electrode pieces 210 are opposed to a surface of the base material 10 via a space (clearance G3). Therefore, the fixed electrode portion 21 is supported by the base portion 22 in a non-contact manner with the base material 10.

The clearance G3 is equivalent to the thickness of the bonding layers 40. That is, after the plurality of fixed electrode pieces 210 are formed, the fixed electrode portion 21 is manufactured by removing the bonding layers 40 that is foundation thereof. A method of forming the fixed electrode pieces 210 is not particularly limited. Typically, the fixed electrode pieces 210 are formed by anisotropic dry etching such as reactive ion etching (RIE). A method of machining the bonding layers 40 is also not particularly limited. For example, an isotropic etching process by which the bonding layers 40 can be selectively removed is applicable thereto. An etching method is not particularly limited and both of wet and dry etching may be used.

The base portion 22 supports the fixed electrode portion 21 and is disposed above the surface of the base material 10 via the bonding layers 40 (bonding portions 421, 422). In this embodiment, the base portion 22 is formed in a columnar shape having a long side in the Y-axis direction.

The base portion 22 includes both end portions (base end portions 221, 222) in the long-side direction and the suspension portion 220 provided between the base end portions 221, 222. The suspension portion 220 supports the plurality of fixed electrode pieces 210.

Each of the base end portions 221, 222 is formed in a rectangular shape having parallel two sides in the X-axis direction and the Y-axis direction. Each of the base end portions 221, 222 has a thickness approximately identical to that of the fixed electrode portion 21. The base portion 22 is disposed above the surface of the base material 10 via the bonding portions 421, 422 (first bonding portions). The bonding portions 421, 422 are each disposed between the base end portions 221, 222 and the base material 10. The base end portions 221, 222 and the bonding portions 421, 422 function as anchor portions that support the fixed electrode layer 20 with respect to the base material 10.

The bonding portions 421, 422 are formed by patterning the bonding layers 40 interposed between the base material 10 and the fixed electrode layer 20 (20L, 20R) into predetermined shapes. Typically, after shape machining of the fixed electrode portion 21 and the base portion 22, the bonding layers 40 forming foundation of the fixed electrode portion 21 and the suspension portion 220 are removed by etching as described above, such that the bonding portions 421, 422 are each formed.

The bonding portions 421, 422 are each formed in an approximately rectangular shape similar to each of the base end portions 221, 222. The size of each bonding portion 421, 422 is typically smaller than that of each base end portions 221, 222. It is caused by side etching in patterning of the bonding layers 40. The amount of side etching depends on etching conditions. The amount of side etching is set to correspond to a size equivalent to the width dimension of the fixed electrode piece 210 along the Y-axis direction, for example.

Both ends of the suspension portion 220 are connected to the base end portions 221, 222. The suspension portion 220 is formed of a plate portion parallel to the Y-axis direction. The suspension portion 220 has a width along the X-axis direction which is smaller than the width of each of the base end portions 221, 222 and is smaller than the height dimension along the Z-axis direction as shown in FIG. 2. The width of the suspension portion 220 is typically a width approximately identical to that of each of the plurality of fixed electrode pieces 210 or a width approximately twice as large as it. However, the width of the suspension portion 220 is not limited thereto as a matter of course.

Connection positions between the suspension portion 220 and the base end portions 221, 222 are not particularly limited. In this embodiment, the connection positions between the suspension portion 220 and the base end portions 221, 222 are set to positions closest to the movable electrode layer 30. That is, in the one fixed electrode layer 20L, as shown in FIG. 1, the suspension portion 220 is connected to a lower right corner of the base end portion 221 and an upper right corner of the base end portion 222. Meanwhile, in the other fixed electrode layer 20R, as shown in FIG. 1, the suspension portion 220 is connected to a lower left corner of the base end portion 221 and an upper left corner of the base end portion 222.

The suspension portion 220 has a thickness approximately identical to the fixed electrode portion 21. As partially shown in FIG. 2, the suspension portion 220 is opposed to the surface of the base material 10 via the space (clearance G3). That is, the suspension portion 220 is supported by the base end portions 221, 222 in a non-contact manner with the base material 10. The suspension portion 220 is formed simultaneously with a formation step for the fixed electrode portion 21. The bonding layer 40 forming the foundation of the suspension portion 220 is, as described above, removed by etching simultaneously with a removal step for the bonding layer 40 forming the foundation of the fixed electrode portion 21.

Movable Electrode Layer

The movable electrode layer 30 is disposed between the fixed electrode layer 20L and the fixed electrode layer 20R. The movable electrode layer 30 is formed in a symmetrical shape with respect to a center line parallel to the Y-axis direction.

The movable electrode layer 30 includes a movable electrode portion 31 (second electrode portion) and the base portion 32 (second base portion). The movable electrode portion 31 and the base portion 32 are each formed having an approximately identical thickness.

In this embodiment, the movable electrode portion 31 includes a plurality of movable electrode pieces 310 extending in the X-axis direction and arrayed in the Y-axis direction. The number of movable electrode pieces 310 is not particularly limited. The number of movable electrode pieces 310 is appropriately set corresponding to required device characteristics. As shown in FIG. 1, the plurality of movable electrode pieces 310 are formed protruding leftward and rightward from a suspension portion 320 of the base portion 32.

The plurality of movable electrode pieces 310 are arrayed at equal intervals. The movable electrode pieces 310 are disposed in the Y-axis direction mutually opposed to the fixed electrode pieces 210 located on a lower side thereof in FIG. 1 via clearances G1, and to the fixed electrode pieces 210 located on an upper side thereof in FIG. 1 via clearances G2. That is, the movable electrode pieces 310 are arrayed in the Y-axis direction alternately with the fixed electrode pieces 210. Further, the plurality of movable electrode pieces 310 are configured to be movable relative to the plurality of fixed electrode pieces 210 in the Y-axis direction.

Although the size of each clearance G1 and the size of each clearance G2 may be approximately identical to each other, the clearances G1, G2 are typically set to different values for stabilizing a movement direction of the movable electrode pieces 310 during application of a voltage from the power supply for control Vcont. In this embodiment, the clearance G1 is set to a value smaller than the clearance G2. With this, the movable electrode pieces 310 are stably moved on the lower side of FIG. 1 during application of a voltage. The size of the clearance G1 is not particularly limited and is 1 µm or more, 5 µm or less, for example.

The plurality of movable electrode pieces 310 are each formed in an approximately identical shape. Each of the plurality of movable electrode pieces 310 has a length direction along the X-axis direction, a width direction along the Y-axis direction, and a height (thickness) direction along the Z-axis direction. Each of the movable electrode pieces 310 is formed having width and thickness approximately identical to those of the fixed electrode piece 210. That is, the movable electrode piece 310 is formed in a plate shape whose height dimension along the Z-axis direction is larger than the width dimension along the Y-axis direction and is perpendicular to the base material 10. Lower ends of the movable electrode pieces 310 are, as shown in FIG. 2, opposed to the surface of the base material 10 via the space (clearance G3). Therefore, the movable electrode portion 31 is supported by the base portion 32 in a non-contact manner with the base material 10.

The base portion 32 supports the movable electrode portion 31 and is disposed above the base material 10 via the bonding layers 40 (bonding portions 431, 432). In this embodiment, the base portion 32 includes the suspension portion 320, a plurality of base end portions 321, 322, and a plurality of coupling pieces 323.

The suspension portion 320 is disposed between the left and right fixed electrode pieces 210 and supports the plurality of fixed electrode pieces 210. The suspension portion 320 is formed in a columnar shape having a long side in the Y-axis direction and has a grid structure in which a plurality of approximately rectangular hollow portions 320a are arrayed in a long-side direction thereof. The thickness of the suspension portion 320 and the width of the grip portion thereof are approximately identical to the thickness and the width of each of the movable electrode pieces 310, respectively. The length of the suspension portion 320 is shorter than the length of the suspension portion 220 of the fixed electrode layer 20.

The plurality of base end portions 321, 322 are disposed between the left and right fixed electrode layers 20L, 20R. A pair of base end portions 321 and a pair of base end portions 322 are disposed such that the base end portions of each of the pairs are opposed to each other in the Y-axis direction. The pair of base end portions 321 and the pair of base end portions 322 are opposed to each other in the X-axis direction. Each of the base end portions 321, 322 is formed in a rectangular shape having two sides parallel to the X-axis direction and the Y-axis direction. Each of the base end portions 321, 322 has a thickness approximately identical to that of the movable electrode portion 31. Each of the base end portions 321, 322 is formed having a size approximately identical to that of each of the base end portions 221, 222 of the fixed electrode layer 20.

The plurality of coupling pieces 323 are provided at both ends of the suspension portion 320. The plurality of coupling pieces 323 are each formed having an approximately identical shape. As in the movable electrode pieces 310, each of the plurality of coupling pieces 323 has a length direction along the X-axis direction, a width direction along the Y-axis direction, and a height direction along the Z-axis direction. Both ends of each coupling piece 323 are connected to the base end portions 321, 322. Both ends of the suspension portion 320 are connected to center portions of the coupling pieces 323. Each coupling piece 323 is formed having a width approximately identical to a width of each of the movable electrode pieces 310.

The plurality of coupling pieces 323 are configured to be elastically deformable in the Y-axis direction. That is, each coupling piece 323 is configured like a double-supported beam whose both ends are supported by the base end portions 321, 322 and is elastically reciprocable between a normal position shown by the solid line of FIG. 1 and a deformation position shown by the long dashed double-short dashed line. With this, the suspension portion 320 whose both ends are coupled to the coupling pieces 323 and the plurality of movable electrode pieces 310 supported by the suspension portion 320 are integrally movable in the Y-axis direction with respect to the fixed electrode pieces 210. Note that a stopper (not shown in figure) that limits the amount of movement of the movable electrode portion 31 may be disposed on the base material 10.

The base portion 32 is disposed on the surface of the base material 10 via the plurality of bonding portions 431, 432 (second bonding portions). The bonding portions 431, 432 are disposed between the base end portions 321, 322 and the base material 10. The base end portions 321, 322 and the bonding portions 431, 432 function as anchor portions that support the movable electrode layer 30 with respect to the base material 10.

The bonding portions 431, 432 are formed by patterning the bonding layers 40 interposed between the base material 10 and the movable electrode layer 30 into predetermined shapes. Typically, after shape machining of the movable electrode portion 31 and the base portion 32, the bonding layers 40 forming foundation of the movable electrode portion 31, the suspension portion 320, and the coupling pieces 323 are removed by etching as described above, such that the bonding portions 431, 432 are formed.

The bonding portions 431, 432 are each formed in an approximately rectangular shape similar to each of the base end portions 321, 322. The size of each of the bonding portions 431, 432 is typically smaller than the size of each of the base end portions 321, 322. It is caused by side etching in patterning of the bonding layers 40. The amount of side etching depends on etching conditions. The amount of side etching is set to correspond to a size equivalent to the width dimension along the Y-axis direction of the movable electrode pieces 310, for example.

The suspension portion 320 and the coupling pieces 323 are opposed to the surface of the base material 10 via the space (clearance G3). That is, the suspension portion 320 and the coupling pieces 323 are supported by the base end portions 321, 322 in a non-contact manner with the base material 10. The suspension portion 320 and the coupling pieces 323 are formed simultaneously with a formation step for the movable electrode portion 31. The bonding layers 40 forming the foundation of the suspension portion 320 and the coupling pieces 323 are removed by etching simultaneously with a removal step for the bonding layers 40 forming the foundation of the movable electrode portion 31.

Operation of Electrostatic Device

Subsequently, a typical operation of the electrostatic device 101 configured in the above-mentioned manner will be described.

Figure 3:
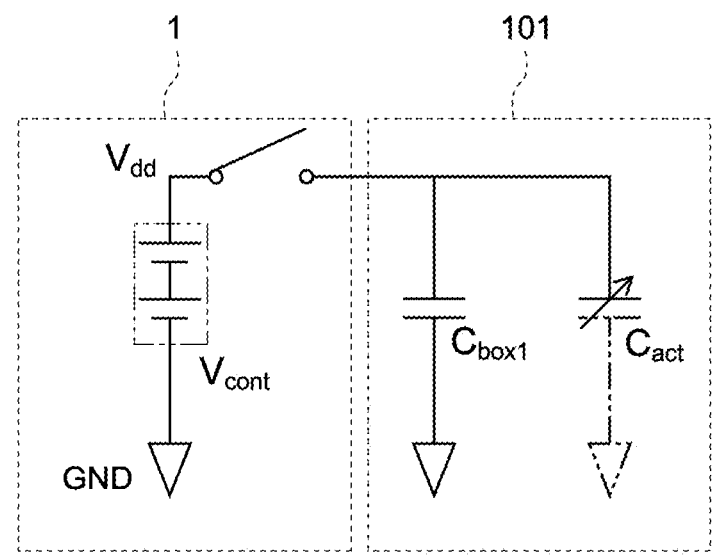
FIG. 3 A diagram showing an equivalent circuit of the electrostatic device shown in FIG. 1.

FIG. 3 shows an equivalent circuit of The electrostatic device 101 shown in FIG. 1. In the figure, a fixed portion of the electrostatic device 101, such as the fixed electrode portion 21, is shown by the solid line and a movable portion such as the movable electrode portion 31 is shown by the long dashed double-short dashed line.

The electrostatic device 101 is connected to a control circuit 1 including the power supply for control Vcont. In this embodiment, as shown in FIG. 1, a positive electrode of the power supply for control Vcont is connected to the one base end portion 221 of each of the fixed electrode layers 20L, 20R via a signal line S1 (signal input line). A negative electrode of the power supply for control Vcont is connected to the one base end portion 322 of the movable electrode layer 30 via a signal line S2. The negative electrode of the power supply for control Vcont and the base material 10 are each connected to a ground (GND) potential.

The power supply for control Vcont is constituted of a constant-voltage source (direct-current power supply). The power supply for control Vcont supplies the fixed electrode layer 20 with a driving potential (Vdd) and the movable electrode layer 30 with a GND potential (0V). The electrostatic device 101 is expressed by a variable capacitance Cact between the plurality of fixed electrode pieces 210 and the plurality of movable electrode pieces 310 and a grounded capacitance Cbox1 caused by the bonding portions 421, 422.

When a driving potential from the power supply for control Vcont is applied on the electrostatic device 101, electric charges are accumulated in the variable capacitance Cact and the grounded capacitance Cbox1. The value of the variable capacitance Cact increases in inverse proportion to a distance between the fixed electrode portion 21 and the movable electrode portion 31 each of which has the comb-teeth structure. Such a distance is fixed due to the motion limit of the actuator mechanism. An upper limit of Cact is thus determined.

When a driving potential is input into the fixed electrode layer 20 and a GND potential is input into the movable electrode layer 30, a potential difference occurs between the fixed electrode portion 21 and the movable electrode portion 31. Electrostatic attraction force due to the potential difference acts in such a direction that the plurality of fixed electrode pieces 210 and the plurality of movable electrode pieces 310 disposed in parallel approach each other. The movable electrode portion 31 is moved up to such a position that elastic restoration force of the coupling pieces 323 is balanced with electrostatic attraction force, a position at which it is brought into contact with the stopper (not shown), or a position at which it is brought into contact with the fixed electrode portion 21. On the other hand, when the driving potential is released, the movable electrode portion 31 is restored to the normal position shown by the solid line of FIG. 1 due to elastic restoration force of the coupling pieces 323.

The electrostatic device 101 configured in the above-mentioned manner is configured as an electrostatic actuator operated by ON-OFF of a driving potential. In this case, the electrostatic device 101 is applied to a switching element, a filter element, or the like, and configures a front end of a communication device installed in a mobile terminal or a base station, for example.

Further, when the control circuit 1 is configured as a detection circuit that detects changes in capacitance between the fixed electrode portion 21 and the movable electrode portion 31, the electrostatic device 101 is, for example, configured as an electrostatic sensor for an acceleration sensor, a pressure sensor, or the like. In this case, the signal line S1 can be used as a signal output line.

Here, both of the electrode layers 20, 30 are fixed to the surface of the base material 10 with the base end portions 221, 222 of the fixed electrode layer 20 and the base end portions 321, 322 of the movable electrode layer 30 being fixed thereto via the bonding portions 421, 422, 431, 432, respectively. Therefore, those base end portions 221, 222, 321, 322 are electrically inductively coupled to the base material 10 via the bonding portions 421, 422, 431, 432, the bonding portions 421, 422, 431, 432 are parasitic in the device as a grounded capacitance Cbox. Thus, this grounded capacitance Cbox1 affects device characteristics of the electrostatic device 101, which is ignorable.

Comparison Example

Figure 4:
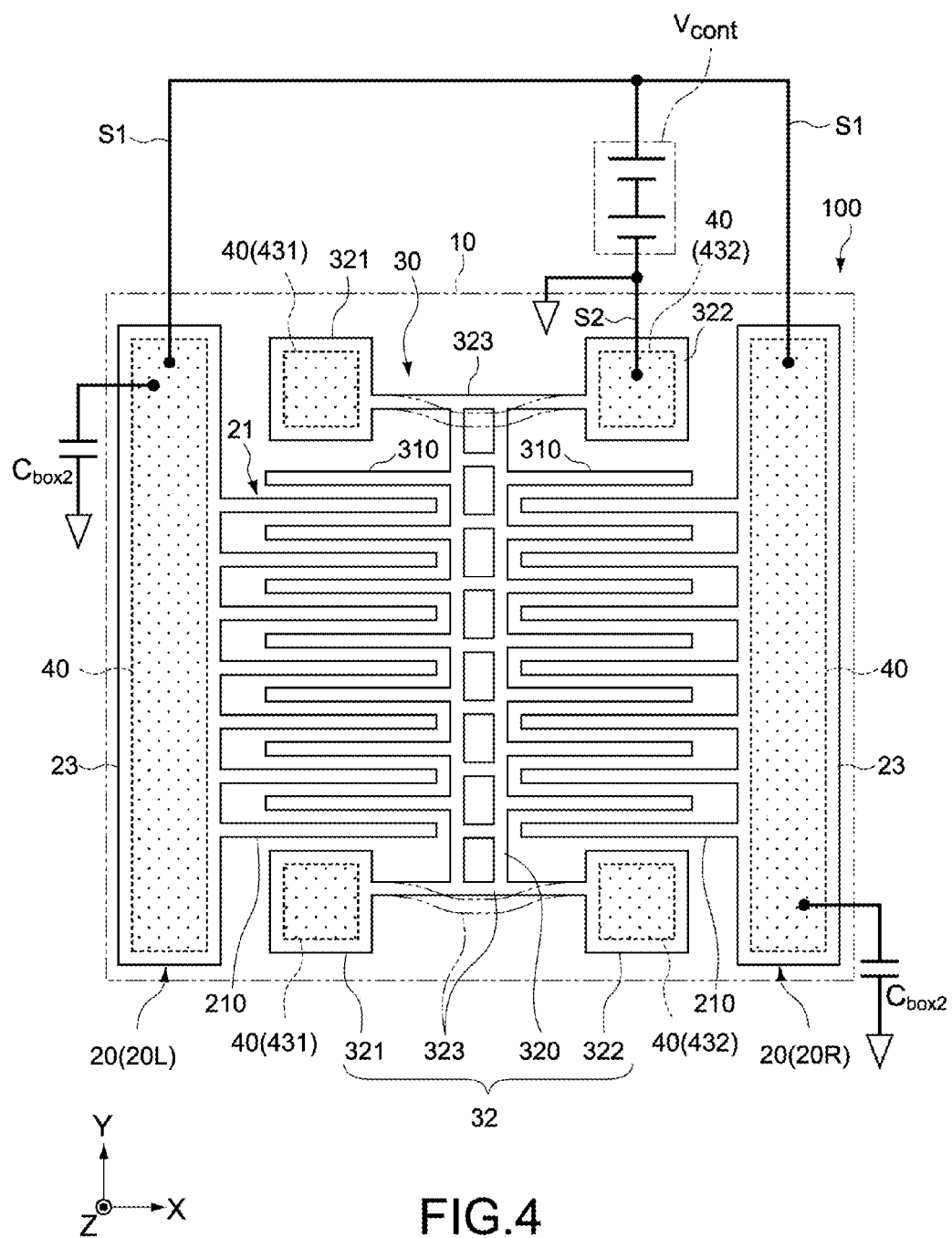
FIG. 4 A schematic plan view showing a configuration of an electrostatic device according to a comparison example.

FIG. 4 is a schematic plan view showing a configuration of an electrostatic device 100 according to a comparison example. Portions of FIG. 4, which correspond to those of FIG. 1, will be denoted by identical symbols and detailed descriptions thereof will be omitted.

The electrostatic device 100 according to the comparison example is common to the electrostatic device 101 according to this embodiment because the electrostatic device 100 according to the comparison example includes the base material 10, the fixed electrode layer 20 (20L, 20R), the movable electrode layer 30, and the bonding layers 40. Meanwhile, the electrostatic device 100 according to the comparison example is different from the electrostatic device 101 according to this embodiment in view of base portions 23 of the fixed electrode layer 20.

In the electrostatic device 100 according to the comparison example, approximately entire regions of the base portions 23 that support the fixed electrode portion 21 are supported by the surface of the base material 10 via the bonding layers 40. As shown in FIG. 4, a planar shape of each of the base portions 23 is a columnar shape having a long side in the Y-axis direction. The bonding layers 40 are each formed in an approximately rectangular planar shape corresponding to the planar shape of the base portion 23.

Figure 5:
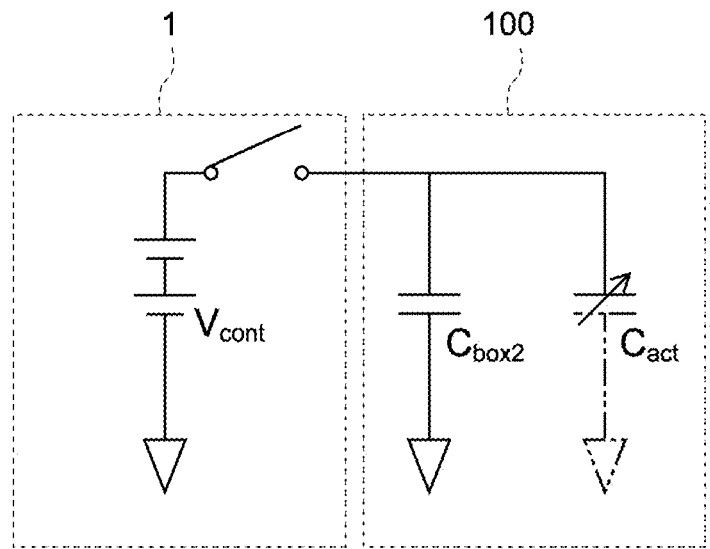
FIG. 5 A diagram showing an equivalent circuit of the electrostatic device according to the comparison example.

FIG. 5 shows an equivalent circuit of the electrostatic device 100 according to the comparison example. In the figure, a fixed portion of the electrostatic device 100, such as the fixed electrode portion 21, is shown by the solid line and a movable portion such as the movable electrode portion 31 is shown by the long dashed double-short dashed line. The electrostatic device 100 is expressed by a variable capacitance Cact between the plurality of fixed electrode pieces 210 and the plurality of movable electrode pieces 310 and a grounded capacitance Cbox2 caused by the bonding portions 421, 422.

In the electrostatic device 100 according to the comparison example, the grounded capacitance Cbox2 causes technical problems as follows.

Firstly, when the electrostatic device 100 is configured as an electrostatic actuator, a potential (Vbox2) during OFF of the actuator mechanism is generated by electric charges generated in the grounded capacitance Cbox2. Electric charges generated in the grounded capacitance Cbox2 are caused by impurities mixed into or adhering to the bonding layers 40, lattice defects in silicon oxide films forming the bonding layers 40, or the like. Once the value of Vbox2 exceeds a threshold, a control voltage is continuously applied on the actuator mechanism even when a driving potential is not applied on the actuator mechanism. In this state, the control theory does not work or an ON-OFF timing chart changes, which induces a failure mode.

Figure 6:
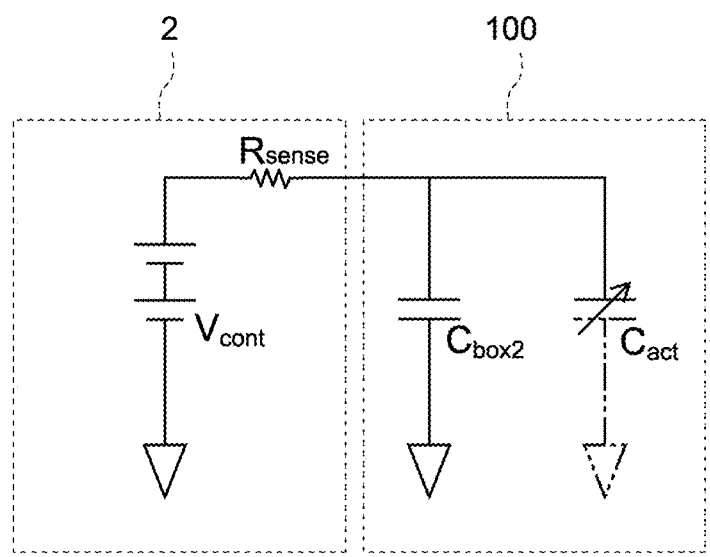
FIG. 6 A diagram showing an example of a detection circuit provided when the electrostatic device is configured as an electrostatic sensor.

Secondly, when the electrostatic device 100 is configured as an electrostatic sensor, the detection sensitivity of the sensing mechanism drifts due to electric charges generated by the grounded capacitance Cbox2. FIG. 6 shows an example of a detection circuit 2 provided when the electrostatic device is configured as an electrostatic sensor. In this case, the detection circuit 2 measures a change ΔC in capacitance of the variable capacitance Cact on the basis of a potential difference at both ends of a resistor Rsense. At this time, if the grounded capacitance Cbox2 has the above-mentioned Vbox2, the potential difference measured at the resistor Rsense drifts from the potential difference equivalent to ΔC which should be detected.

In this manner, the amount of electric charge of the grounded capacitance Cbox2 fluctuates every time the operation of the actuator mechanism or sensing mechanism is repeated. Therefore, it is a power-supply bias fluctuation effect for the actuator mechanism or a reference-voltage fluctuation effect for the sensing mechanism, which may result in a failure of the device.

Thirdly, both when the electrostatic device 100 is configured as an electrostatic actuator and when it is configured as an electrostatic sensor, electric power due to electric charges in and out of Cbox2 corresponds to unnecessary loss. For example, when the area of Cbox2 is several mm$^2$, it becomes a so-called grounded parasitic capacitance, which can be electrically considered as a capacitance having several to several hundreds of pF. Therefore, with a small electrostatic device manufactured by the MEMS technology, a frequent problems is unnecessary power consumption for the driving circuit or a reduction in detection sensitivity for the detection circuit.

Actions of this Embodiment

On the contrary, in the electrostatic device 101 according to this embodiment, the bonding layers 40 that support the fixed electrode layer 20 (20L, 20R) into which a driving potential is input is configured as the plurality of bonding portions 421, 422 that partially support the base portion 22. Further, the suspension portion 220 that supports the fixed electrode portion 21 (plurality of fixed electrode pieces 210) is configured to be suspended by the base end portions 221, 222 and opposed to the base material 10 via the space (clearance G3). Therefore, the fixed electrode portion 21 can be supported while preventing the grounded capacitance from being caused in the suspension portion 220 due to the bonding layers 40.

Therefore, in accordance with the electrostatic device 101 according to this embodiment, the area of the bonding layers 40 interposed between the base portion 22 and the base material 10 is greatly reduced in comparison with the comparison example, and hence it becomes possible to significantly reduce the grounded capacitance Cbox1 in comparison with the grounded capacitance Cbox2 according to the comparison example. With this, adverse influences on the device, which are caused due to electrification of the bonding layers 40 and the parasitic capacitance (Cbox1), is reduced. Thus, it becomes possible to improve device characteristics, for example, ensure favorable operation characteristics, reduce driving-power consumption, and improve the detection sensitivity.

Further, in the electrostatic device 101 according to this embodiment, the suspension portion 220 is formed of a single plate smaller in width than that of each of the base end portions 221, 222. Therefore, a facing area between the suspension portion 220 and the base material 10 can be minimized and it becomes possible to further reduce the grounded capacitance of the fixed electrode layer 20. In addition, setting the width of the suspension portion 220 to be approximately identical to the width of each of the fixed electrode pieces 210 can improve the accuracy in machining the suspension portion 220 and the bonding layers 40 directly below it by etching.

Note that, although no bonding layers 40 are typically present in a facing region between the suspension portion 220 and the base material 10, it does not necessarily exclude remaining of the bonding layers 40 in such a region. Also in this case, the suspension portion 220 is smaller in width than that of each of the base end portions 221, 222, and hence the grounded capacitance can be reduced in comparison with the comparison example. The same applies to embodiments to be described later.

Second Embodiment

Figure 7:
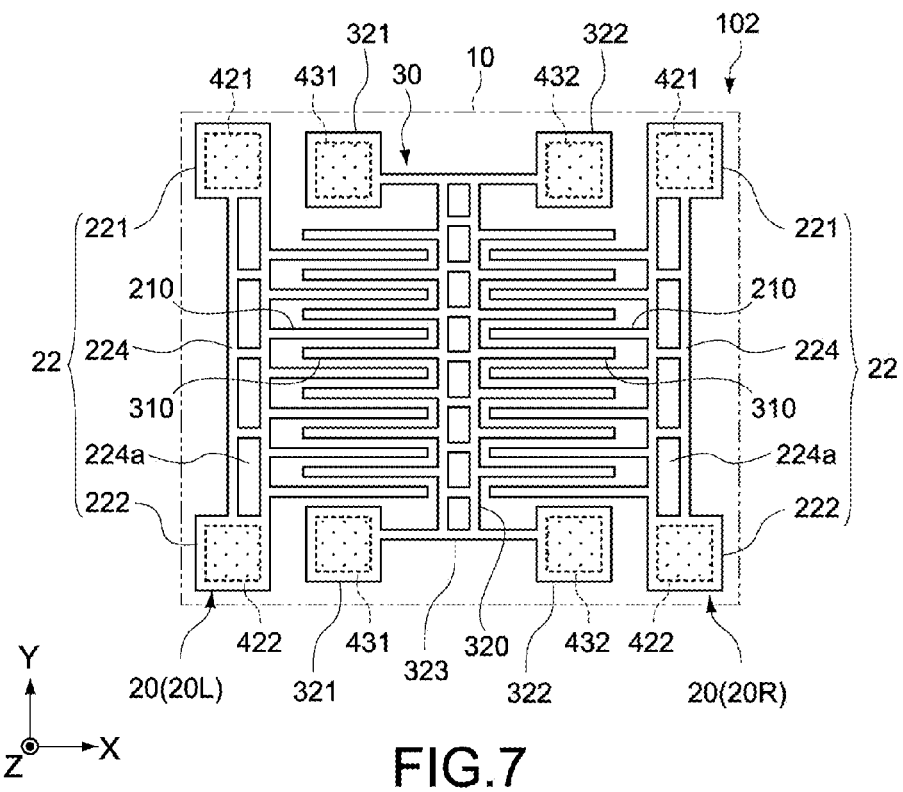
FIG. 7 A schematic plan view showing a configuration of an electrostatic device according to a second embodiment of the present technology.

FIG. 7 is a schematic plan view showing a configuration of an electrostatic device 102 according to a second embodiment of the present technology. Hereinafter, configurations different from those of the first embodiment will be mainly described, configurations similar to those of the above-mentioned embodiments will be denoted by similar symbols, and descriptions thereof will be omitted or simplified.

The electrostatic device 102 according to this embodiment is different from that of the above-mentioned first embodiment in view of a configuration of a base portion 22 of a fixed electrode layer 20 (20L, 20R). That is, in this embodiment, a suspension portion 224 in the base portion 22 has a grid structure (or rudder structure).

As shown in FIG. 7, the suspension portion 224 has both ends connected to base end portions 221, 222 and is opposed to a surface of a base material 10 via a space. Further, the suspension portion 224 has a combination structure of two long plate portions parallel to the Y-axis direction, which are formed between the base end portions 221, 222 in parallel, and a plurality of short plate portions parallel to the X-axis direction. The plurality of short plate portions are formed in parallel so as to couple those two plate portions to each other. The width of each of the plate portions constituting the suspension portion 224 is set to be approximately identical to the width of each of fixed electrode pieces 210 or approximately twice as large as it. However, the width of each plate portion is not limited thereto as a matter of course.

As described above, also with the thus electrostatic device 102, actions and effects similar to those of the first embodiment can be provided. In this embodiment, the suspension portion 224 has a grid structure or rudder structure, and hence it can increase the rigidity of the suspension portion 224 in comparison with the case where it is constituted of a single plate. Further, the suspension portion 224 is formed in a grid shape, and hence the suspension portion 224 is provided with a plurality of hollow portions 224a arrayed in the Y-axis direction. With this, it is possible to reduce the area facing the base material 10 in comparison with a configuration having no hollow portions 224a.

The above-mentioned short plate portions may be formed inclined with respect to the X-axis direction or may be partially bent. In other words, the shape of each of the hollow portions 224a is not limited to the rectangular shape shown in the figure and may be a suitable shape, for example, a triangular shape or a polygonal shape having five or more corners. The same applies to embodiments to be described later.

Third Embodiment

Figure 8:
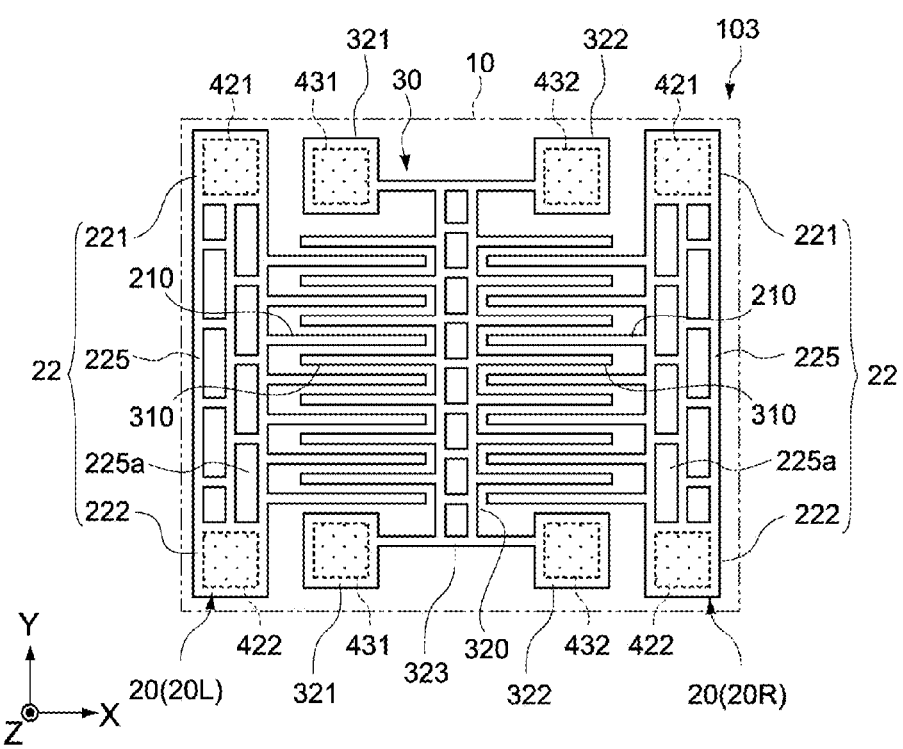
FIG. 8 A schematic plan view showing a configuration of an electrostatic device according to a third embodiment of the present technology.

FIG. 8 is a schematic plan view showing a configuration of an electrostatic device 103 according to a third embodiment of the present technology. Hereinafter, configurations different from those of the first embodiment will be mainly described, configurations similar to those of the above-mentioned embodiments will be denoted by similar symbols, and descriptions thereof will be omitted or simplified.

The electrostatic device 103 according to this embodiment is different from that of the above-mentioned first embodiment in view of a configuration of a base portion 22 of a fixed electrode layer 20 (20L, 20R). That is, in this embodiment, a suspension portion 225 in the base portion 22 has a grid structure as in the second embodiment.

As shown in FIG. 8, a suspension portion 225 has both ends connected to the base end portions 221, 222 and is opposed to a surface of a base material 10 via a space. Further, the suspension portion 225 has a combination structure of three long plate portions parallel to the Y-axis direction, which are formed between the base end portions 221, 222 in parallel, and a plurality of short plate portions parallel to the X-axis direction. The plurality of short plate portions are formed in parallel so as to couple those three plate portions to one other. The plurality of short plate portions may be disposed, aligned in the X-axis direction. Alternatively, the plurality of short plate portions may be, as shown in FIG. 8, disposed, not aligned in the same direction (in zigzag form). The width of each of the plate portions constituting the suspension portion 225 is set to be approximately identical to the width of each of fixed electrode pieces 210 and approximately twice as large as it. However, the width of the plate portion is not limited thereto as a matter of course.

As described above, also with the thus configured electrostatic device 103, actions and effects similar to those of the first embodiment can be provided. In this embodiment, the suspension portion 225 has a grid structure or rudder structure, and hence it can increase the rigidity of the suspension portion 225 in comparison with the case where it is constituted of a single plate as in the second embodiment. Further, the suspension portion 225 is formed in a grid shape, and hence the suspension portion 225 is provided with a plurality of hollow portions 225a arrayed in the X-axis direction and the Y-axis direction. With this, the area facing the base material 10 can be reduced in comparison with a configuration having no hollow portions 225a.

Fourth Embodiment

Figure 9:
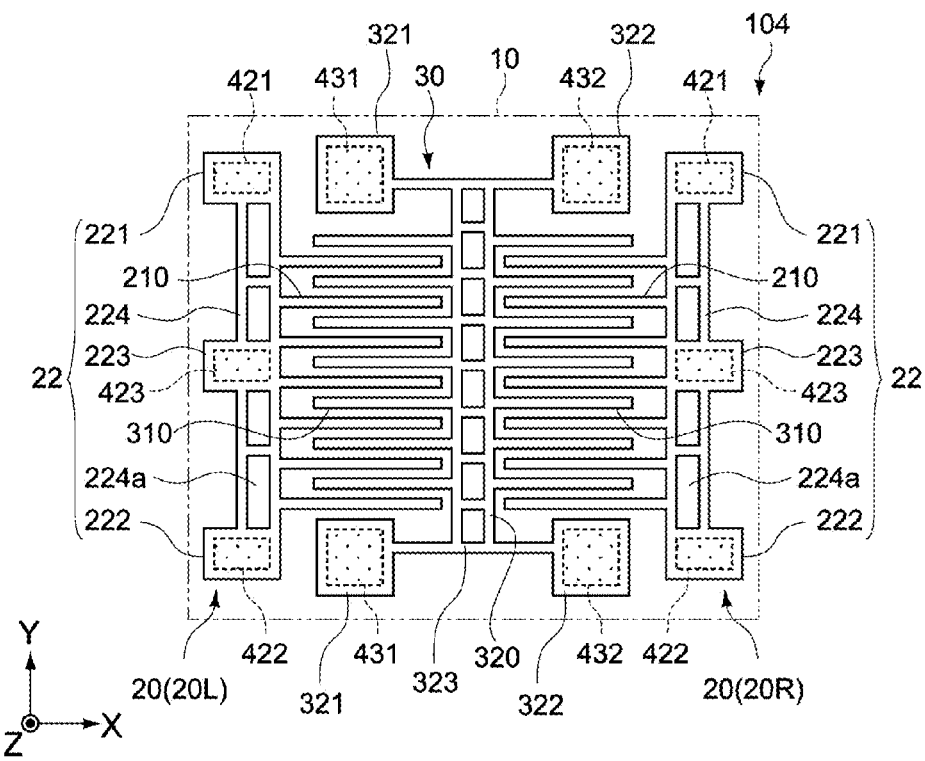
FIG. 9 A schematic plan view showing a configuration of an electrostatic device according to a fourth embodiment of the present technology.

FIG. 9 is a schematic plan view showing a configuration of an electrostatic device 104 according to a fourth embodiment of the present technology. Hereinafter, configurations different from those of the first embodiment will be mainly described, configurations similar to those of the above-mentioned embodiments will be denoted by similar symbols, and descriptions thereof will be omitted or simplified.

The electrostatic device 104 according to this embodiment is different from that of the above-mentioned first embodiment in view of a configuration of a base portion 22 of a fixed electrode layer 20 (20L, 20R). That is, in this embodiment, a suspension portion 224 in the base portion 22 has a grid structure as in the second embodiment and the base portion 22 further includes a base end portion 223 at a center portion thereof. The base end portion 223 is supported by a bonding portion 423.

As shown in FIG. 9, each base end portion 223 is provided between base end portions 221, 222. The base end portion 223 is supported above the surface of the base material 10 via a bonding layer 423 (first bonding portion) formed by patterning bonding layers 40.

The base end portion 223 is formed having shape and size similar to those of the base end portion 221, 222. However, the base end portion 223 is not limited thereto as a matter of course. Suspension portions 224 are provided between the base end portion 221 and the base end portion 223 and between the base end portion 223 and the base end portion 222. The bonding portion 423 also has shape and size similar to those of the bonding portion 421, 422. However, the bonding portion 423 is not limited thereto as a matter of course.

As described above, also with the thus configured electrostatic device 104, actions and effects similar to those of the first embodiment can be provided. In this embodiment, the suspension portion 224 has a grid structure or rudder structure, and hence, it can increase the rigidity of the suspension portion 225 in comparison with the case where it is constituted of a single plate as in the second embodiment. Further, the suspension portion 224 includes a plurality of hollow portions 224a, and hence the area facing the base material 10 can be reduced in comparison with a configuration having no hollow portions 224a.

In addition, the center portion of the suspension portion 224 is relayed through the base end portion 223, and hence the rigidity of the suspension portion 224 can be further increased. Therefore, the suspension portion 224 may be constituted of a single plate as in the first embodiment.

Fifth Embodiment

Figure 10:
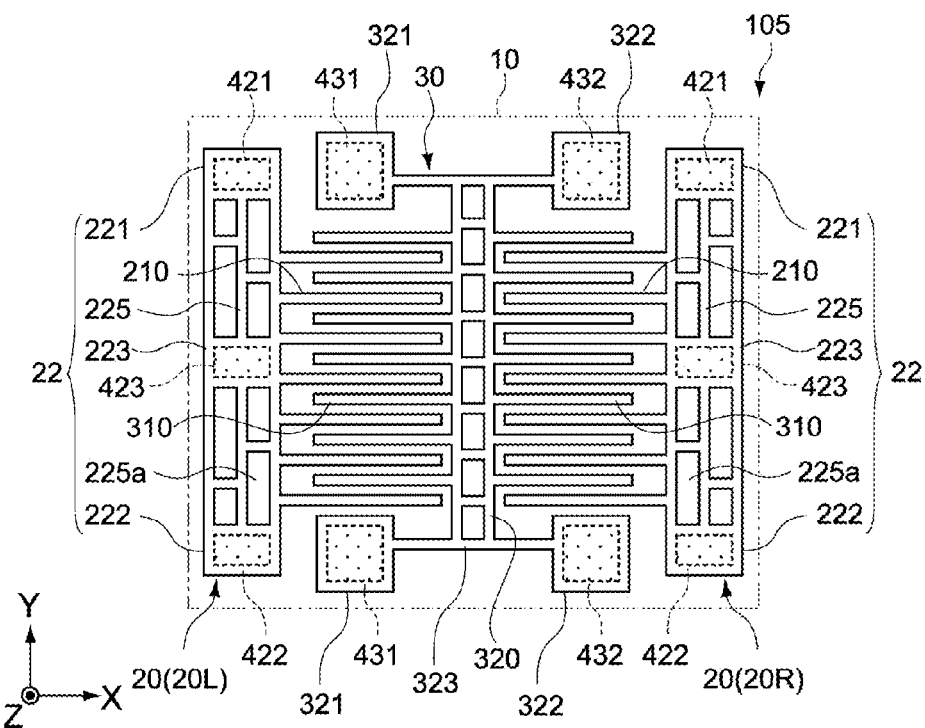
FIG. 10 A schematic plan view showing a configuration of an electrostatic device according to a fifth embodiment of the present technology.

FIG. 10 is a schematic plan view showing a configuration of an electrostatic device 105 according to a fifth embodiment of the present technology. Hereinafter, configurations different from those of the first embodiment will be mainly described, configurations similar to those of the above-mentioned embodiments will be denoted by similar symbols, and descriptions thereof will be omitted or simplified.

The electrostatic device 104 according to this embodiment is different from that of the above-mentioned first embodiment in view of a configuration of a base portion 22 of a fixed electrode layer 20 (20L, 20R). That is, in this embodiment, a suspension portion 225 in the base portion 22 has a grid structure as in the third embodiment and the base portion 22 further includes, as in the fourth embodiment, a base end portion 223 at a center portion thereof. The base end portion 223 is supported by a bonding portion 423.

As described above, also with the thus configured electrostatic device 105, actions and effects similar to those of the first embodiment can be provided. In this embodiment, the suspension portion 225 has a grid structure or rudder structure, and hence the rigidity of the suspension portion 225 can be increased in comparison with the case where it is constituted of a single plate as in the third embodiment. Further, the center portion of the suspension portion 225 is relayed through the base end portion 223, and hence the rigidity of the suspension portion 225 can be further increased. In addition, the suspension portion 225 includes a plurality of hollow portions 225a, and hence the area facing the base material 10 can be reduced in comparison with a configuration having no hollow portions 225a.

Sixth Embodiment

Figure 11:
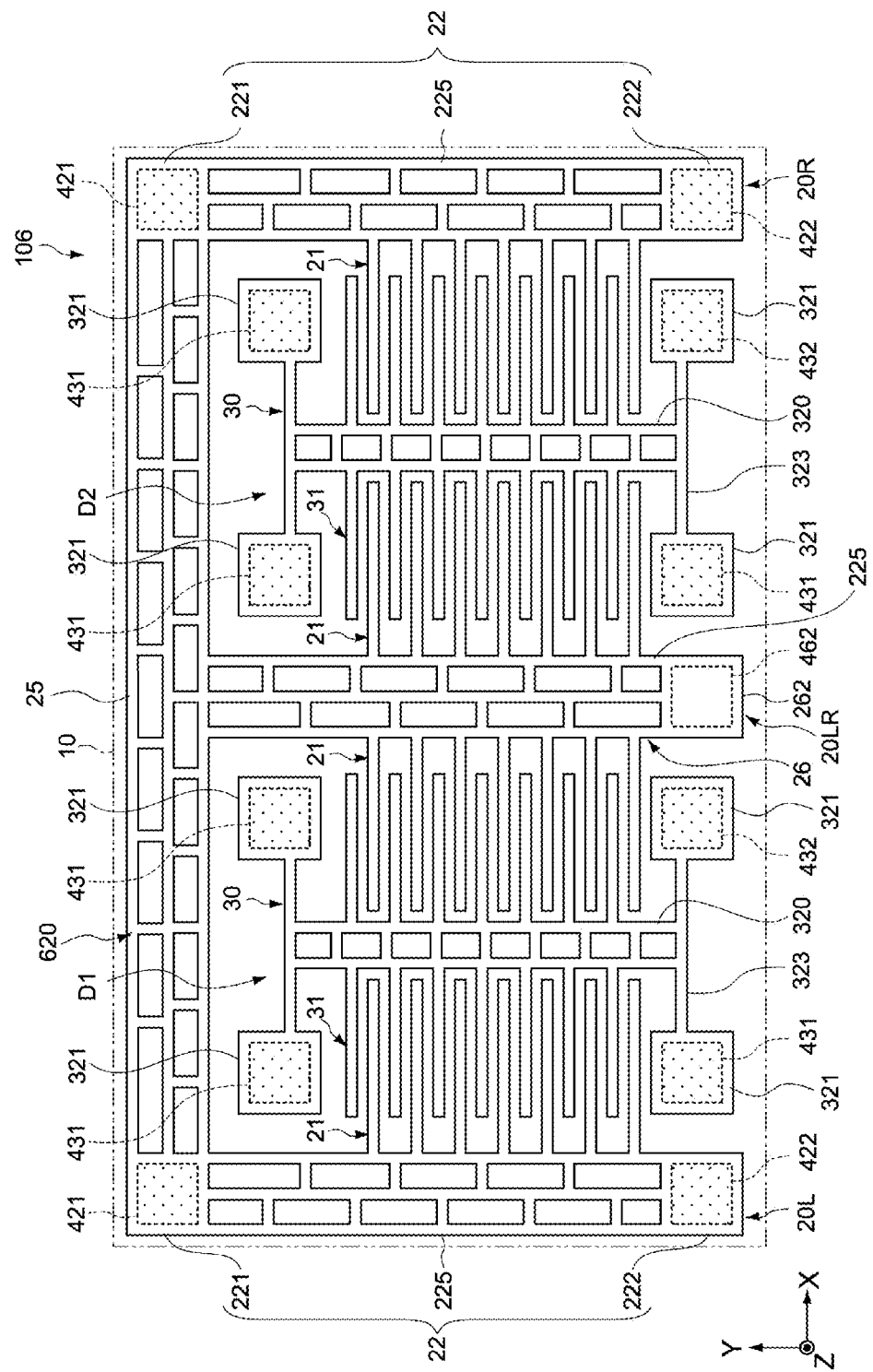
FIG. 11 A schematic plan view showing a configuration of an electrostatic device according to a sixth embodiment of the present technology.

FIG. 11 is a schematic plan view showing a configuration of an electrostatic device 106 according to a sixth embodiment of the present technology. Hereinafter, configurations different from those of the first embodiment will be mainly described, configurations similar to those of the above-mentioned embodiments will be denoted by similar symbols, and descriptions thereof will be omitted or simplified.

The electrostatic device 106 according to this embodiment is different from that of each of the above-mentioned embodiments in that it includes a plurality of device sections D1, D2 on a base material 10. The plurality of device sections D1, D2 each include a fixed electrode layer 20 and a movable electrode layer 30. Each of the electrode layers is supported above the surface of the base material 10 via a plurality of bonding portions 421, 422, 431, 432. That is, the plurality of device sections D1, D2 each constitute a single electrostatic device.

In this embodiment, the two device sections D1, D2 are provided on the base material 10. However, the number of device sections is not limited thereto and three or more device sections may be provided. Further, the device sections D1, D2 are disposed adjacent to each other in the X-axis direction. However, the device sections D1, D2 are not limited thereto and may be disposed adjacent to each other in the Y-axis direction or may be disposed in a matrix form in an XY-plane.

The electrostatic device 106 according to this embodiment includes an electrode layer 620 integrated over the plurality of device sections D1, D2. That is, the electrode layer 620 includes the fixed electrode layers 20L, 20R each having a configuration similar to that of the first embodiment, a fixed electrode layer 20LR common to the device sections D1, D2, and a coupling layer 25 that couples those electrode layers to each other.

The fixed electrode layers 20L, 20R each include, as in the first embodiment, a fixed electrode portion 21 and a base portion 22 that supports it. The base portion 22 includes two base end portions 221, 222 and suspension portions 225 provided between those base end portions 221, 222 to support the fixed electrode portion 21. The suspension portions 225 each have a grid structure having a form similar to that of the third embodiment. However, the suspension portion 225 is not limited thereto as a matter of course. The fixed electrode layers 20L, 20R are fixed to the base material 10 via the bonding portions 421, 422 that partially support the base end portions 221, 222.

The fixed electrode layer 20LR includes fixed electrode portions 21 for the device section D1 and the device section D2, which are provided between the fixed electrode layer 20L and the fixed electrode layer 20R, and a base portion 26 that commonly supports those fixed electrode portions 21. The base portion 26 includes a single base end portion 262 and the suspension portions 225. The suspension portion 225 is provided between the base end portion 262 and the coupling layer 25 to support the above-mentioned fixed electrode portions 21. The suspension portion 225 has a grid structure having a form similar to that of the third embodiment. However, the suspension portion 225 is not limited thereto as a matter of course. The fixed electrode layer 20LR is fixed to the base material 10 via a bonding portion 462 that partially supports the base end portion 262. The bonding portion 462 is formed by pattern etching of bonding layers 40 as in the bonding portions 421, 422 or the like.

The coupling layer 25 extends in parallel to the X-axis direction and has both ends connected to the base end portions 221 of each of the fixed electrode layers 20L, 20R. One end of the suspension portion 225 of the fixed electrode layer 20LR is connected to a middle portion of the coupling layer 25. The coupling layer 25 has a grid structure similar to that of the suspension portion 225. However, the coupling layer 25 is not limited thereto as a matter of course. The coupling layer 25 is disposed opposed to the surface of the base material 10 via a space as in the suspension portion 225.

With the electrostatic device 106 configured in the above-mentioned manner, when a driving potential is input into the electrode layer 620, each of the device sections D1, D2 is driven. The electrode layer 620 is partially fixed to the base material 10 via the plurality of bonding portions 421, 422, 462, and hence the grounded capacitance can be reduced. With this, it becomes possible to improve device characteristics as in the first embodiment.

Further, in this embodiment, a part of the fixed electrode layer can be configured to be shared by the plurality of device sections, and hence there is an advantage in that a degree of integration in arraying the device sections is increased. Further, it becomes possible to reduce the grounded capacitance per unit area.

Figure 12:
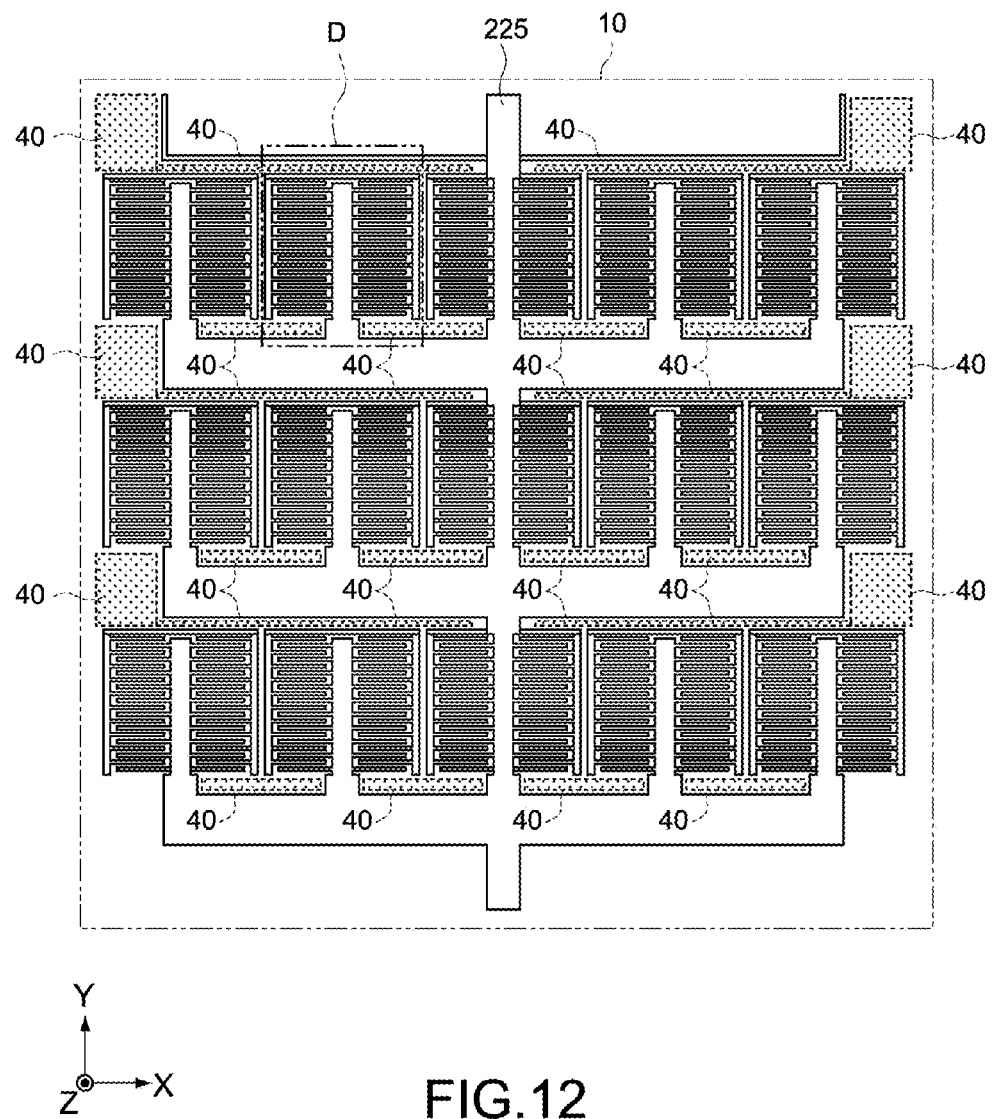
FIG. 12 A schematic plan view showing an array structure of the electrostatic device according to the embodiment of the present technology.

FIG. 12 is a schematic plan view showing a plurality of (fifteen) device sections D arrayed with three rows and five columns on the base material 10 as an example of arraying. The suspension portion 225 that supports fixed electrode pieces of the device sections D is commonly formed among the plurality of device sections D. The suspension portion 225 has a grid structure similar to that of the third embodiment. However, the suspension portion 225 is not limited thereto as a matter of course. The structure of the suspension portion described in each of the other embodiments may be employed. Further, the fixed electrode layer and the movable electrode layer are fixed to the base material 10 via a plurality of bonding layers 40. As shown in the figure, an occupation ratio of the bonding layers 40 in the surface of the base material 10 can be lowered, and hence the grounded capacitance of the device can be greatly reduced.

Seventh Embodiment

Figure 13:
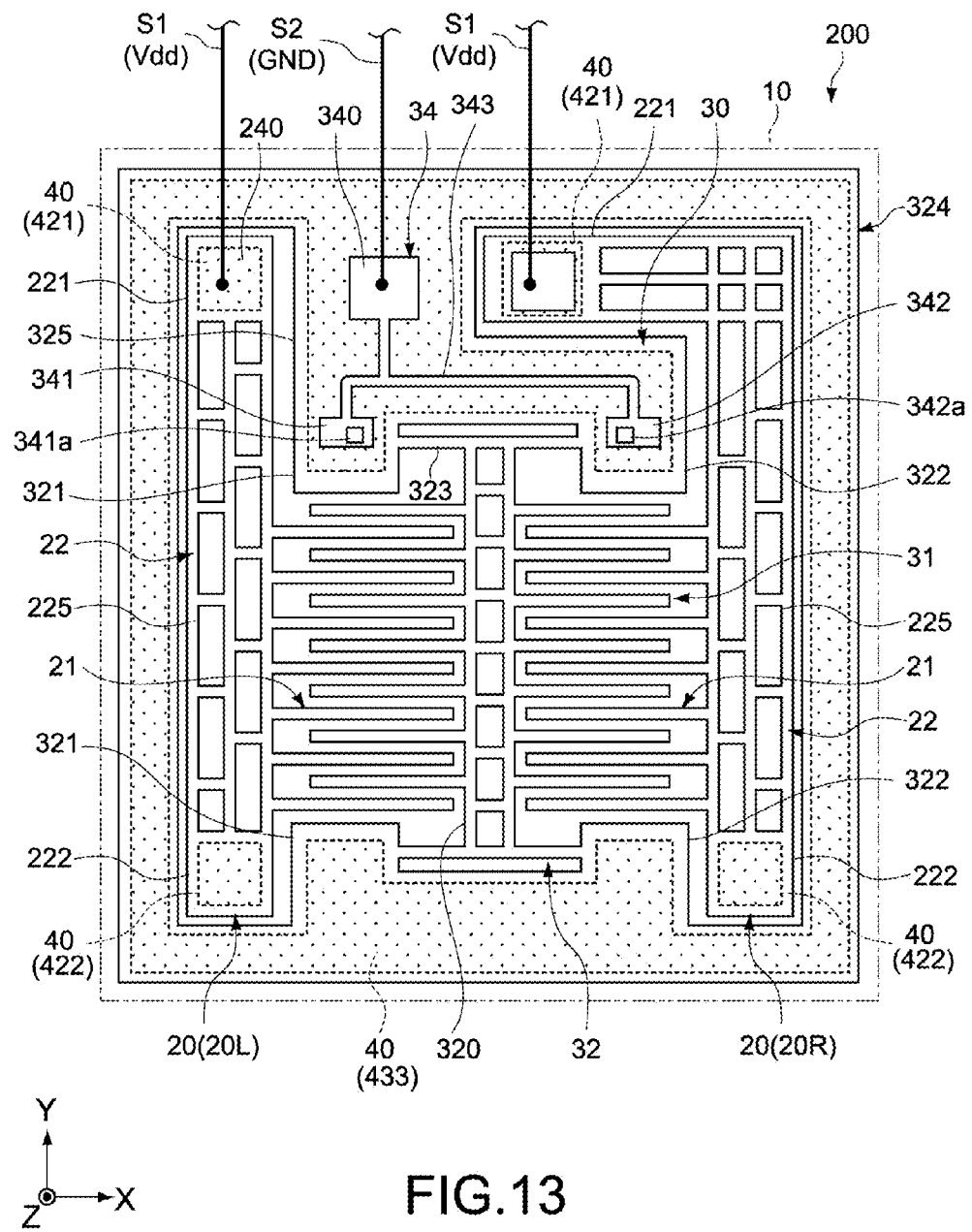
FIG. 13 A schematic plan view showing a configuration of an electrostatic device according to a seventh embodiment of the present technology.

FIG. 13 is a schematic plan view showing a configuration of an electrostatic device 200 according to a seventh embodiment of the present technology. Hereinafter, configurations different from those of the first embodiment will be mainly described, configurations similar to those of the above-mentioned embodiments will be denoted by similar symbols, and descriptions thereof will be omitted or simplified.

In this embodiment, a surrounding structure of a movable electrode layer 30 will be described in detail. As in each of the above-mentioned embodiments, also in this embodiment, a driving potential (Vdd) is input into a fixed electrode layer 20 and the movable electrode layer 30 is connected to the GND potential.

The electrostatic device 200 according to this embodiment includes fixed electrode layers 20 (20L, 20R) disposed above a surface of the base material 10 via bonding layers 40 (bonding portions 421, 422) and a movable electrode layer 30 disposed above the surface of the base material 10 via a bonding layer 40 (bonding portion 433).

The movable electrode layer 30 includes a movable electrode portion 31 and a base portion 32 that supports the movable electrode portion 31. As in the first embodiment, the base portion 32 includes a suspension portion 320 that supports the movable electrode portion 31, elastically deformable coupling pieces 323 provided at both ends of the suspension portion 320, and base end portions 321, 322 that support both ends of the coupling pieces.

The base portion 32 further includes a frame portion 324 and a coupling portion 325. The frame portion 324 is formed having an approximately rectangular shape. The frame portion 324 is provided around base end portions 321, 322 and the fixed electrode layer 20. The coupling portion 325 is formed protruding from an inter peripheral portion of the frame portion 324 toward the two base end portions 321, 322 located on an upper side in FIG. 13. The two base end portions 321, 322 located on a lower side in FIG. 13 are integrally connected to the inter peripheral portion of the frame portion 324.

A conductor pattern 34 is provided in the upper surface of the coupling portion 325. The conductor pattern 34 is electrically connected to a signal line S2. The conductor pattern 34 includes a pad section 340, a first terminal section 341, a second terminal section 342, and a wiring layer 343. The conductor pattern 34 is formed of an electrically conductive material having a resistance lower than the silicon material forming the base portion 32, such as a metal film. Specifically, the conductor pattern is formed of, for example, a laminated film of different kinds of metal such as Au/Ni/Cr and Au/Ti.

The pad section 340 is disposed on the coupling portion 325 and connected to the signal line S2. The first terminal section 341 is disposed on one base end portion 321. The second terminal section 342 is disposed on the other base end portion 322.

Figure 14:
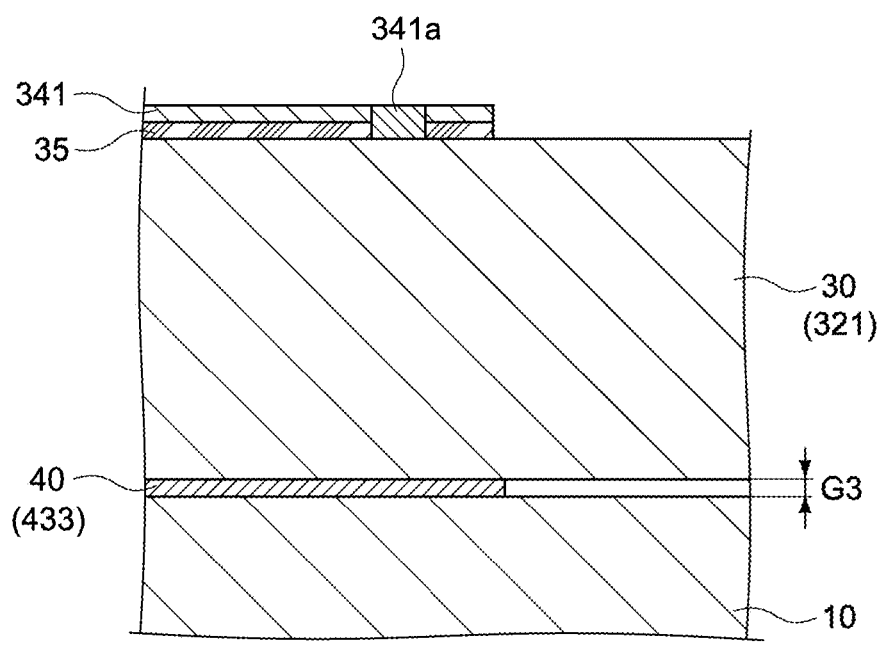
FIG. 14 A longitudinal sectional view of main parts in a formation region of a terminal section in the electrostatic device shown in FIG. 13.

FIG. 14 is a longitudinal sectional view of main parts in a formation region of the first terminal section 341. The conductor pattern 34 is provided above the base portion 32 (base end portion 321 and coupling portion 325) via an interlayer insulating layer 35 such as SiO₂ and SiN. Further, the first terminal section 341 is, at a predetermined position thereof, provided with a contact portion 341a that passes through the interlayer insulating layer 35 and is electrically connected to the base end portion 321 that is foundation. The second terminal section 342 is also, at a predetermined position thereof, provided with a contact portion 342a (FIG. 13) that passes through the interlayer insulating layer 35 and is electrically connected to the base end portion 322 that is foundation.

The wiring layer 343 electrically connects the pad section 340, the first terminal section 341, and the second terminal section 342 to one another. The wiring layer 343 connects first and second terminal sections 341, 342 to the pad section 340 in parallel.

The base portion 32 of the movable electrode layer 30 is fixed to the surface of the base material 10 via the bonding portion 433. The bonding portion 433 is formed by patterning the bonding layer 40 into a predetermined shape. In this embodiment, the bonding portion 433 is provided in regions directly below the base end portions 321, 322, the frame portion 324, and the coupling portion 325.

On the other hand, the base end portion 221 of each of the fixed electrode layers 20L, 20R is provided with a pad section 240 connected to a signal line S1. The pad section 240 is electrically connected to the base end portion 221. The pad section 240 applies a driving potential, which is input via the signal line S1, on the entire fixed electrode layer 20.

The pad section 240 is typically formed of an electrically conductive material having a resistance lower than the silicon material forming the base portion 22. As the electrically conductive material, a metal laminated film can be employed as in the material forming the above-mentioned conductor pattern 34.

The fixed electrode layer 20 is configured in a manner similar to that of the first embodiment, and hence detailed descriptions thereof will be omitted. Any configuration described in each of the above-mentioned embodiments can be employed as the configuration of the fixed electrode layer 20. Note that, in this embodiment, as shown in FIG. 13, a suspension portion 225 in the fixed electrode layer 20R has a structure bent by approximately 90° so as to go around one base end portion 322 of the movable electrode layer 30.

Eighth Embodiment

Figure 15:
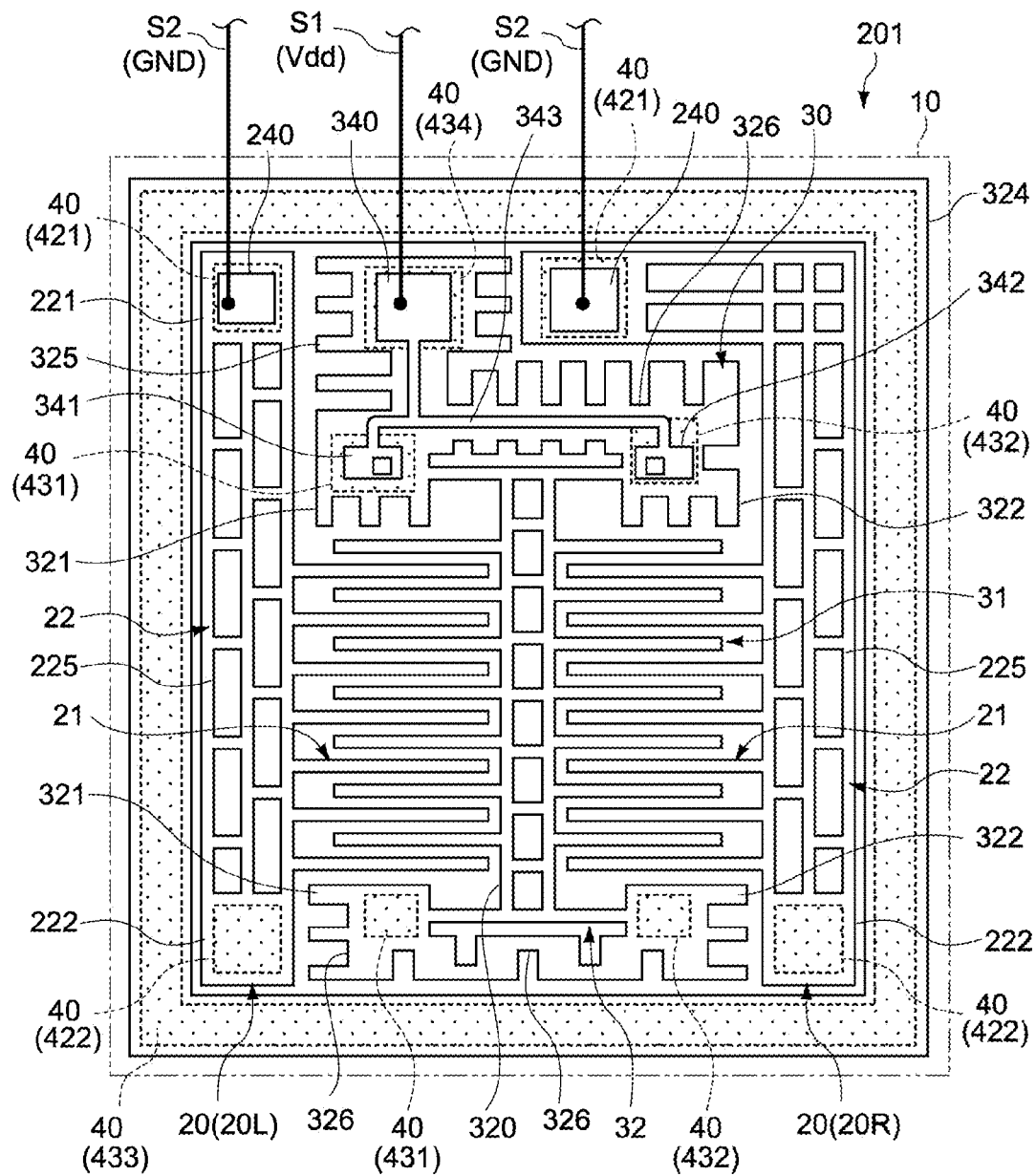
FIG. 15 A schematic plan view showing a configuration of an electrostatic device according to an eighth embodiment of the present technology.

FIG. 15 is a schematic plan view showing a configuration of an electrostatic device 201 according to an eighth embodiment of the present technology. Hereinafter, configurations different from those of the seventh embodiment will be mainly described, configurations similar to those of the above-mentioned embodiments will be denoted by similar symbols, and descriptions thereof will be omitted or simplified.

In the above-mentioned first to seventh embodiments, a signal input line (S1) is connected to a fixed electrode layer 20. In this embodiment, a signal input line (S1) is connected to a movable electrode layer 30 and a GND line (S2) is connected to the fixed electrode layers 20 (20L, 20R). Therefore, in this embodiment, the movable electrode layer 30 is equivalent to the "first conductor layer" and the fixed electrode layer 20 is equivalent to the "second conductor layer".

In the electrostatic device 201 according to this embodiment, a base portion 32 in the movable electrode layer 30 is formed while being separated from a frame portion 324. Therefore, the frame portion 324 and base end portions 321, 322 and coupling portion 325 of the base portion 32 are electrically insulated from each other. Note that the frame portion 324 is connected to the GND potential as in the base material 10.

In the electrostatic device 201 according to this embodiment, the base portion 32 in the movable electrode layer 30 is partially supported by a plurality of bonding portions 431, 432, 434 (second bonding portions). The bonding portions 431, 432, 434 are formed by pattern etching of the bonding layers 40. The bonding portions 431, 432, 434 are provided in a region directly below the base end portions 321, 322 and the coupling portion 325.

Figure 16:
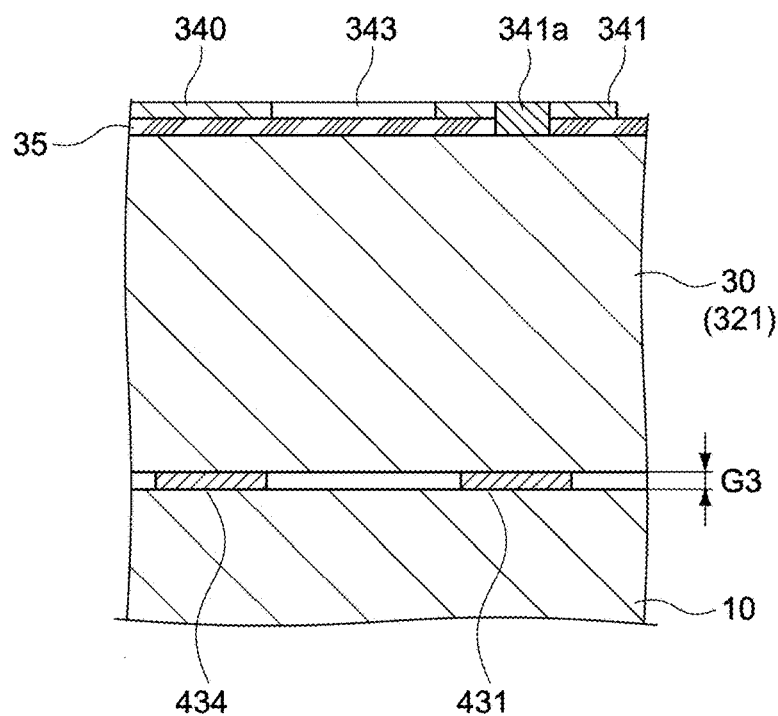
FIG. 16 A longitudinal sectional view of main parts in a formation region of a pad section and a terminal section in the electrostatic device shown in FIG. 15.

In particular, in this embodiment, with respect to the coupling portion 325 of the movable electrode layer 30 and the base end portions 321, 322 coupled thereto, the bonding portion 431 is selectively disposed directly below a first terminal section 341, the bonding portion 432 is selectively disposed directly below a second terminal section 342, and the bonding portion 434 is selectively disposed directly below a pad section 340. FIG. 16 is a longitudinal sectional view of main parts in a formation region of the pad section 340 and the first terminal section 341.

In addition, in this embodiment, a plurality of cutouts 326 are provided around the coupling portion 325 and the base end portions 321, 322 of the movable electrode layer 30. The cutouts 326 can reduce an area facing of those coupling portion 325 and base end portions 321, 322 and the base material 10 and enables suitable pattern etching of the bonding portions 431, 432, 434 to be performed.

The formation intervals, formation width, and depth of the cutouts 326 are not particularly limited and can be appropriately set. With respect to the base end portions 321, 322 in which the first and second terminal sections 341, 342 are provided, the cutouts 326 are formed along an extending direction of a wiring layer 343. With this, it becomes possible to efficiently remove the bonding layers 40 directly below the base portion 32, on which the wiring layer 343 is formed, by etching.

With the electrostatic device 201 configured in the above-mentioned manner, a positive electrode of a power supply for control (not shown) is connected to the pad section 340 of the movable electrode layer 30 and a negative electrode is connected to the pad section 240 of the fixed electrode layer 20. When a driving potential (Vdd) is input into the movable electrode layer 30, the movable electrode portion 31 is moved relative to the fixed electrode portion 21 in the Y-axis direction due to electrostatic attraction force and a capacitance between both electrode portions is variably controlled. On the other hand, when the input of the driving potential is stopped, the movable electrode portion 31 is restored to a normal position shown in the figure due to elastic restoration force of the coupling pieces 323.

Figure 17:
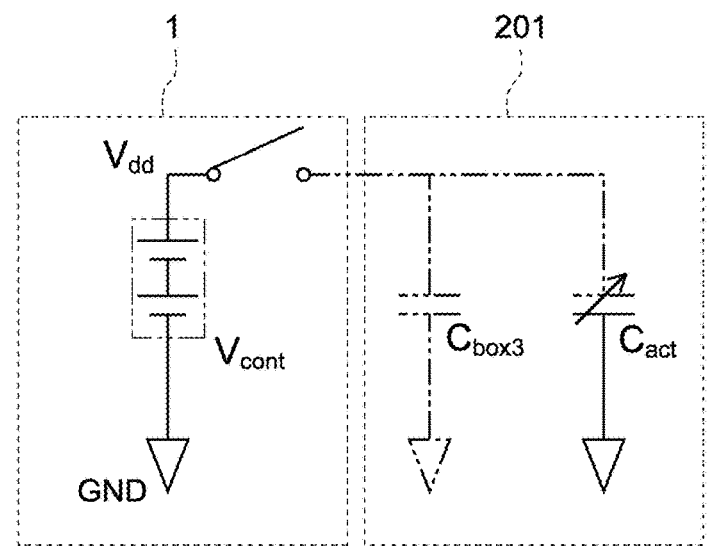
FIG. 17 A diagram showing an equivalent circuit of the electrostatic device shown in FIG. 15.

FIG. 17 shows an equivalent circuit of the electrostatic device 201 shown in FIG. 15. In the figure, a fixed portion of the electrostatic device 201, such as the fixed electrode portion 21, is shown by the solid line and a movable portion such as the movable electrode portion 31 is shown by the long dashed double-short dashed line.

In the electrostatic device 201 according to this embodiment, the bonding layers 40 that support the movable electrode layer 30 into which a driving potential is input is configured as the plurality of bonding portions 431, 432, 434 that partially support the base portion 22. Further, the suspension portion 320 that supports the movable electrode portion 31 (plurality of movable electrode pieces 310) is suspended by the base end portions 321, 322 and opposed to the base material 10 via the space (clearance G3). Thus, the movable electrode portion 31 can be supported while preventing the grounded capacitance Cbox3 (FIG. 17) from being caused in the suspension portion 320 due to the bonding layers 40.

Therefore, in accordance with the electrostatic device 201 according to this embodiment, the area of the bonding layers 40 interposed between the base portion 32 and the base material 10 can be greatly reduced, and hence the grounded capacitance of the movable electrode layer 30 can be reduced. With this, as in the first embodiment, it becomes possible to ensure favorable operation characteristics and reduce the driving power consumption. Further, when the electrostatic device 201 is configured as an electrostatic sensor, it becomes possible to improve the detection sensitivity.

Further, in accordance with this embodiment, no bonding layers 40 are present also directly below the wiring layer 343, and hence the grounded capacitance (parasitic capacitance) between the wiring layer 343 and the base material 10 can be eliminated. With this, it can contribute to enhancement of the device characteristics.

In addition, in accordance with this embodiment, a driving potential input into the pad section 340 is supplied to each of the first and second terminal sections 341, 342 via the wiring layer 343, and hence driving potentials can be approximately evenly input into those terminal sections 341, 342. With this, electrostatic attraction force to the fixed electrode layers 20L, 20R can be synchronously generated.

Figure 18:
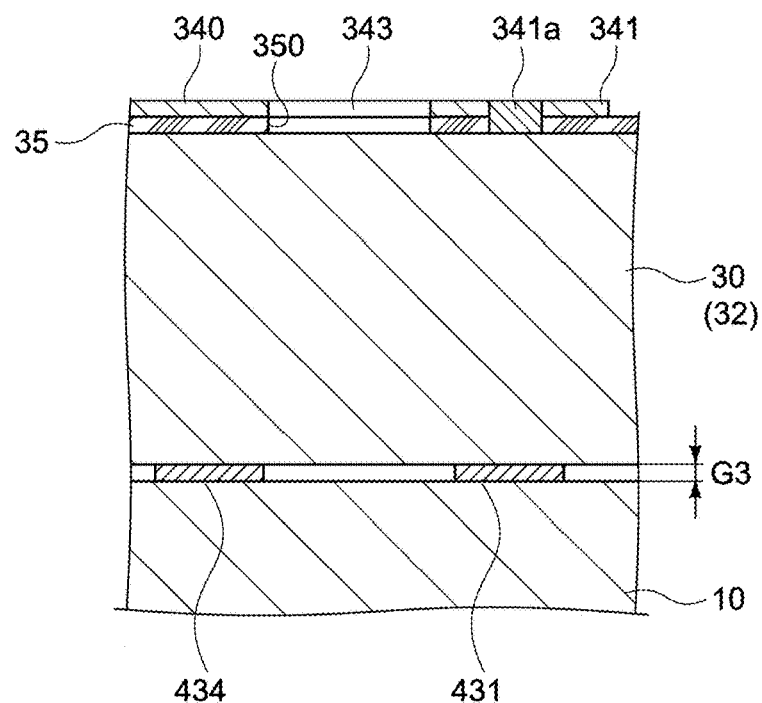
FIG. 18 A longitudinal sectional view of main parts showing another configuration example of the electrostatic device shown in FIG. 15.

Here, as shown in FIG. 18, the interlayer insulating layer 35 directly below the wiring layer 343 may be provided with a gap portion 350 that forms a clearance between the base portion 32 and the wiring layer 343. The interlayer insulating layer 35 is configured to include the gap portion 350, and hence the parasitic capacitance between the wiring layer 343 and the base portion 32 can be reduced. Accordingly, it becomes possible to further reduce the driving power consumption or further improve the detection sensitivity.

Figure 19:
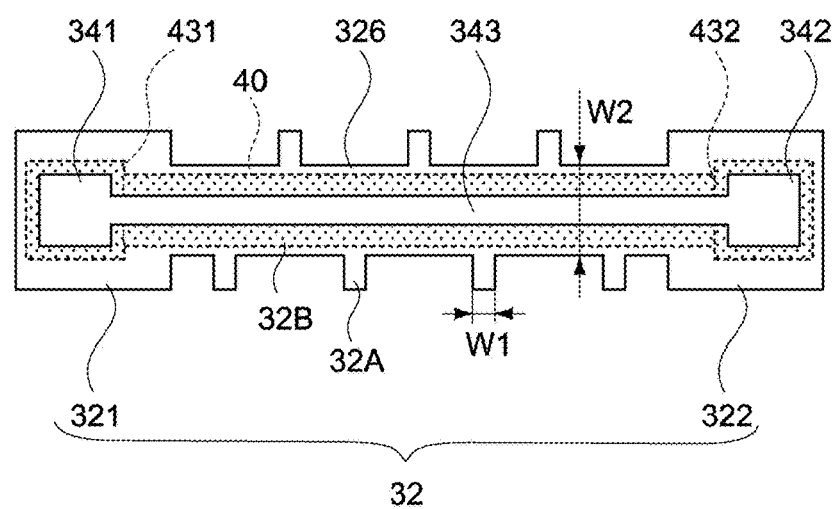
FIG. 19 A main-part plan view showing another configuration example of the electrostatic device shown in FIG. 15.

Although it is favorable that the bonding layers 40 located directly below the wiring layer 343 is all removed, some of them may remain. The amount of removal of the bonding layers 40 is effectively set such that the cutouts 326 are provided around the base end portions 321, 322 as described above. At this time, for example, as shown in FIG. 19, a shorter width (W1) of each of cutout remaining portions 32A of the base portion 32, which remain due to the cutouts 326, is set to be approximately equal to the width (FIG. 15) of each of the movable electrode pieces 310 along the Y-axis direction or approximately twice as large as it. With this, it is possible to efficiently remove etch the bonding layers 40 directly below the cutout remaining portions 32A.

Further, it is possible to efficiently remove etch the bonding layers 40 directly below the wiring layer 343. Further, by deeply forming the cutouts 326, a mean of shorter widths (W2) of a cutout remaining portion 32B of the base portion 32 also becomes smaller, and hence the amount of removal of the bonding layer directly below the cutout remaining portion 32B increases and all of the bonding layers can also be removed.

Figure 20:
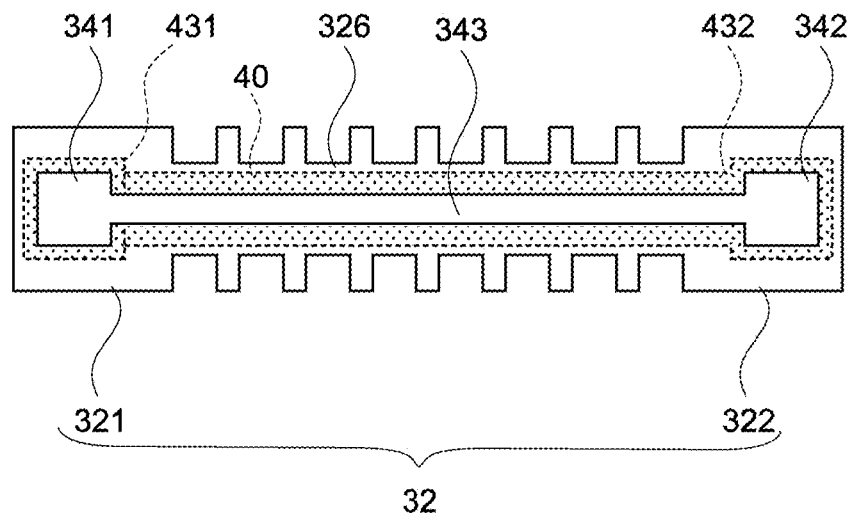
FIG. 20 A main-part plan view showing another configuration example of the electrostatic device shown in FIG. 15.
Figure 21:
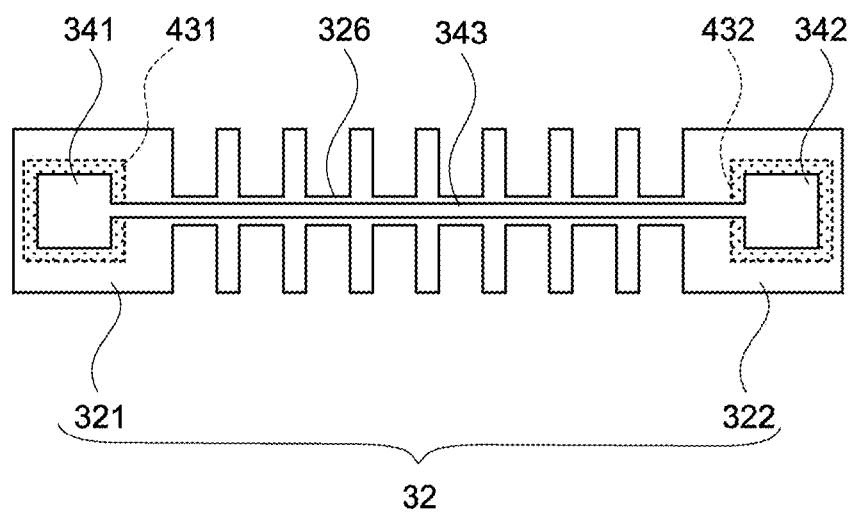
FIG. 21 A main-part plan view showing another configuration example of the electrostatic device shown in FIG. 15.

Alternatively, as shown in FIG. 20, formation intervals of the cutouts 326 may be made smaller in comparison with the example of FIG. 19 and, as shown in FIG. 21, a formation depth of the cutout 326 may be deeper in comparison with the example of FIG. 19.

Figure 22:
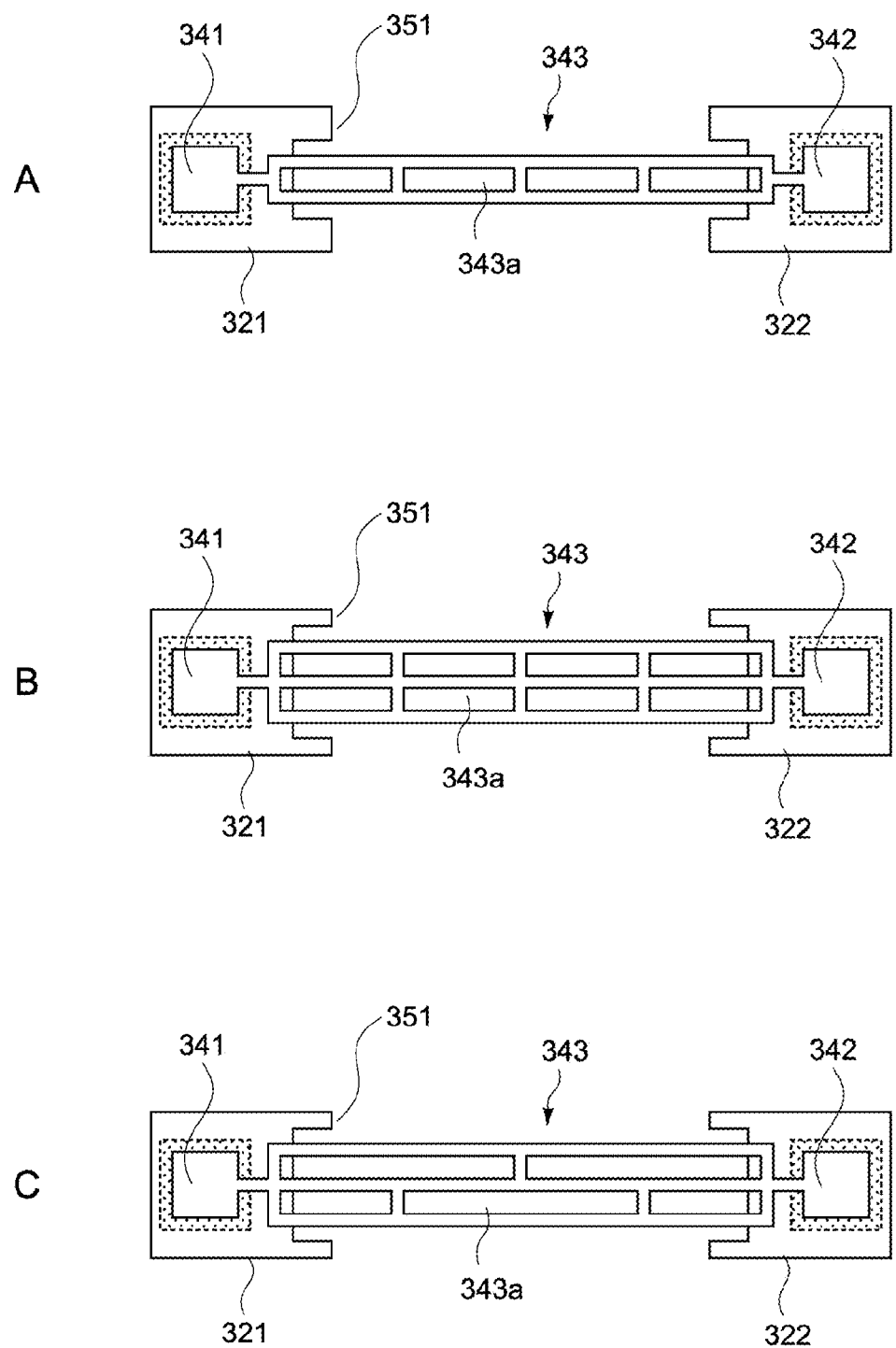
FIG. 22 A main-part plan view showing another configuration example of the electrostatic device shown in FIG. 15.

The wiring layer 343 is not limited to the example in which it is constituted of wirings in a single column, and it may be formed in a grid shape as shown in A to C of FIG. 22. With this, a plurality of hollow portions 343a are formed in the formation region of the wiring layer 343. Further, the wiring layer 343 having such a structure is used as an etching mask, and the interlayer insulating layer 35, the base portion 32, and the bonding layers 40 directly below the wiring layer 343 can be removed by etching. With the above-mentioned configuration, both of the interlayer insulating layer 35 and the base portion 32 are provided with a gap portion 351 that forms a clearance between the base material 10 and the wiring layer 343.

In accordance with the above-mentioned configuration, a suspension structure in which both ends of the wiring layer 343 are supported by the first and second terminal sections 341, 342 can be provided. The grounded capacitance (parasitic capacitance) of the wiring layer 343 can be further reduced. Note that, also in this case, the width of a grid section that constitutes the wiring layer 343 is approximately equivalent to the width of each of the movable electrode pieces 310, for example, or approximately twice as large as it.

Although the embodiments of the present technology have been described above, the present technology is not limited only to the above-mentioned embodiments and various modifications can be made as a matter of course.

For example, in each of the above-mentioned embodiments, the fixed electrode portion and the movable electrode portion of the electrostatic device are each formed in a comb teeth shape. However, the electrode form is not limited thereto and the structure other than the comb teeth structure may be employed.

Further, although the above-mentioned embodiments employs the electrode lay-out in which the fixed electrode layers 20 are disposed on both sides of the movable electrode layer 30, the electrode structure in which a single fixed electrode layer and a single movable electrode layer are combined can also be employed.

In addition, the electrostatic device according to the present technology is applicable to various actuators or sensors utilizing electrostatic attraction force or changes in capacitance between the electrodes.

It should be noted that the present technology may also take the following configurations.

(1) An electrostatic device, including:
  an electrically conductive base material;
  a first conductor layer including
    a first electrode portion, and
    a first base portion that supports the first electrode portion and is disposed on the base material, the first conductor layer being connected to a signal line;
  a second conductor layer including
    a second electrode portion that is opposed to the first electrode portion in a first axis direction and movable relative to the first electrode portion in the first axis direction, and
    a second base portion that supports the second electrode portion and is disposed on the base material, the second conductor layer being connected to a reference potential; and
  an electrically isolative bonding layer disposed between the base material and the first and second base portions, the electrically isolative bonding layer including a plurality of first bonding portions that partially support at least the first base portion.

(2) The electrostatic device according to (1), in which
  the first base portion is formed in a columnar shape having a long side in the first axis direction, and
  the first electrode portion includes a plurality of electrode pieces extending in a second axis direction crossing the first axis direction, the plurality of electrode pieces being arrayed in the first axis direction.

(3) The electrostatic device according to (2), in which
  the first base portion includes
    both end portions in the long-side direction, which are supported by the plurality of first bonding portions, and
    a suspension portion that is provided between the both end portions and supports the plurality of electrode pieces.

(4) The electrostatic device according to (3), in which
  the suspension portion is formed of a plate portion whose width along the second axis direction is narrower than a width of each of the both end portions and is smaller than a height dimension along a third axis direction orthogonal to the first and second axis directions.

(5) The electrostatic device according to (3), in which
  the suspension portion includes a plurality of hollow portions.

(6) The electrostatic device according to (5), in which
  the suspension portion has a grid structure.

(7) The electrostatic device according to any one of (2) to (6), in which
  the plurality of first bonding portions support the both end portions and a center portion of the first base portion in a longitudinal direction.

(8) The electrostatic device according to any one of (2) to (7), in which
  the second electrode portion includes a plurality of electrode pieces opposed to a plurality of electrode pieces that constitute the first electrode portion, and
  the second base portion includes an elastically deformable coupling piece that supports the second electrode portion to be movable in the first axis direction.

(9) The electrostatic device according to any one of (1) to (8), in which
  the bonding layer further includes a plurality of second bonding portions that partially support the second base portion.

(10) The electrostatic device according to any one of (1) to (7), in which
  the first electrode portion includes a plurality of electrode pieces extending in a second axis direction crossing the first axis direction, the plurality of electrode pieces being arrayed in the first axis direction, and
  the first base portion includes an elastically deformable coupling piece that supports the first electrode portion to be movable in the first axis direction.

(11) The electrostatic device according to (10), further including:
  a pad section disposed on the first base portion and electrically connected to the signal line;
  a terminal section disposed on the first base portion and electrically connected to the first base portion;
  a wiring layer that electrically connects between the pad section and the terminal section; and
  an interlayer insulating layer disposed between the first base portion and the wiring layer, in which
  the plurality of first bonding portions are selectively disposed directly below the terminal section.

(12) The electrostatic device according to (11), in which
  the first base portion includes a plurality of cutouts formed along an extending direction of the wiring layer.

(13) The electrostatic device according to (11) or (12), in which
  the interlayer insulating layer includes a gap portion that forms a clearance between the first base portion and the wiring layer.

(14) The electrostatic device according to any one of (11) to (13), in which
  the interlayer insulating layer and the first base portion each include a gap portion that forms a clearance between the base material and the wiring layer.

(15) The electrostatic device according to any one of (1) to (14), in which
the base material and the first and second conductor layers are each formed of a silicon substrate, and
the bonding layer is constituted of a silicon oxide film.
(16) The electrostatic device according to any one of (1) to (15), in which
the signal line configures a signal input line that generates electrostatic force between the first electrode portion and the second electrode portion.
(17) The electrostatic device according to any one of (1) to (15), in which
the signal line configures a signal output line that outputs a voltage signal corresponding to a relative distance between the first electrode portion and the second electrode portion.

REFERENCE SIGNS LIST 10 base material
20, 20L, 20R fixed electrode layer
21 fixed electrode portion
210 fixed electrode piece
22 base portion
220 suspension portion
221, 222 base end portion
30 movable electrode layer
31 movable electrode portion
310 movable electrode piece
32 base portion
320 suspension portion
321, 322 base end portion
323 coupling piece
340 pad section
341 first terminal section
342 second terminal section
343 wiring layer
35 interlayer insulating layer
40 bonding layer
421, 422, 431, 432 bonding portion
101, 102, 103, 104, 105, 106, 200, 201 electrostatic device

The invention claimed is:

1. An electrostatic device, comprising:
an electrically conductive base material;
a first conductor layer including
a first electrode portion, and
a first base portion that supports the first electrode portion and is disposed on the base material, the first conductor layer being connected to a signal line;
a second conductor layer including
a second electrode portion that is opposed to the first electrode portion in a first axis direction and movable relative to the first electrode portion in the first axis direction, and
a second base portion that supports the second electrode portion and is disposed on the base material, the second conductor layer being connected to a reference potential; and
an electrically isolative bonding layer disposed between the base material and the first and second base portions, the electrically isolative bonding layer including a plurality of first bonding portions that partially support at least the first base portion.

2. The electrostatic device according to claim 1, wherein the first base portion is formed in a columnar shape having a long side in the first axis direction, and
the first electrode portion includes a plurality of electrode pieces extending in a second axis direction crossing the first axis direction, the plurality of electrode pieces being arrayed in the first axis direction.

3. The electrostatic device according to claim 2, wherein the first base portion includes
both end portions in the long-side direction, which are supported by the plurality of first bonding portions, and
a suspension portion that is provided between the both end portions and supports the plurality of electrode pieces.

4. The electrostatic device according to claim 3, wherein the suspension portion is formed of a plate portion whose width along the second axis direction is narrower than a width of each of the both end portions and is smaller than a height dimension along a third axis direction orthogonal to the first and second axis directions.

5. The electrostatic device according to claim 3, wherein the suspension portion includes a plurality of hollow portions.

6. The electrostatic device according to claim 5, wherein the suspension portion has a grid structure.

7. The electrostatic device according to claim 2, wherein the plurality of first bonding portions support the both end portions and a center portion of the first base portion in a longitudinal direction.

8. The electrostatic device according to claim 2, wherein the second electrode portion includes a plurality of electrode pieces opposed to a plurality of electrode pieces that constitute the first electrode portion, and
the second base portion includes an elastically deformable coupling piece that supports the second electrode portion to be movable in the first axis direction.

9. The electrostatic device according to claim 1, wherein the bonding layer further includes a plurality of second bonding portions that partially support the second base portion.

10. The electrostatic device according to claim 1, wherein the first electrode portion includes a plurality of electrode pieces extending in a second axis direction crossing the first axis direction, the plurality of electrode pieces being arrayed in the first axis direction, and
the first base portion includes an elastically deformable coupling piece that supports the first electrode portion to be movable in the first axis direction.

11. The electrostatic device according to claim 10, further comprising:
a pad section disposed on the first base portion and electrically connected to the signal line;
a terminal section disposed on the first base portion and electrically connected to the first base portion;
a wiring layer that electrically connects between the pad section and the terminal section; and
an interlayer insulating layer disposed between the first base portion and the wiring layer, wherein
the plurality of first bonding portions are selectively disposed directly below the terminal section.

12. The electrostatic device according to claim 11, wherein
the first base portion includes a plurality of cutouts formed along an extending direction of the wiring layer.

13. The electrostatic device according to claim 11, wherein
the interlayer insulating layer includes a gap portion that forms a clearance between the first base portion and the wiring layer.

14. The electrostatic device according to claim 11, wherein
the interlayer insulating layer and the first base portion each include a gap portion that forms a clearance between the base material and the wiring layer.

15. The electrostatic device according to claim 1, wherein
the base material and the first and second conductor layers are each formed of a silicon substrate, and
the bonding layer is constituted of a silicon oxide film.

16. The electrostatic device according to claim 1, wherein
the signal line configures a signal input line that generates electrostatic force between the first electrode portion and the second electrode portion.

17. The electrostatic device according to claim 1, wherein
the signal line configures a signal output line that outputs a voltage signal corresponding to a relative distance between the first electrode portion and the second electrode portion.

* * * * *